United States Patent
Tsutsui

(10) Patent No.: US 9,852,023 B2
(45) Date of Patent: Dec. 26, 2017

(54) MEMORY SYSTEM AND INFORMATION PROCESSING SYSTEM

(71) Applicant: Semiconductor Energy Laboratory Co., Ltd., Atsugi-shi, Kanagawa-ken (JP)

(72) Inventor: Naoaki Tsutsui, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 15 days.

(21) Appl. No.: 15/047,729

(22) Filed: Feb. 19, 2016

(65) Prior Publication Data

US 2016/0253236 A1    Sep. 1, 2016

(30) Foreign Application Priority Data

Feb. 26, 2015  (JP) ................. 2015-036768

(51) Int. Cl.
  *G11C 29/00* (2006.01)
  *G06F 11/10* (2006.01)
  *G11C 29/52* (2006.01)

(52) U.S. Cl.
  CPC .......... *G06F 11/1068* (2013.01); *G11C 29/52* (2013.01)

(58) Field of Classification Search
  None
  See application file for complete search history.

(56) References Cited

U.S. PATENT DOCUMENTS

| 8,482,974 B2 | 7/2013 | Saito et al. |
| 8,484,409 B2 | 7/2013 | Honda |
| 2004/0156251 A1* | 8/2004 | Shiota .................. G11C 16/349 365/200 |
| 2008/0288814 A1 | 11/2008 | Kitahara |

(Continued)

FOREIGN PATENT DOCUMENTS

| JP | 2005-078378 A | 3/2005 |
| JP | 2008-287404 A | 11/2008 |

(Continued)

OTHER PUBLICATIONS

International Search Report (Application No. PCT/IB2016/050865) dated Apr. 26, 2016.

(Continued)

*Primary Examiner* — Daniel McMahon
(74) *Attorney, Agent, or Firm* — Fish & Richardson P.C.

(57) ABSTRACT

A memory system that includes an error check and correct (ECC) circuit is provided. The memory system includes a memory, the ECC circuit, and a processor. The memory includes a user data region and a management region. The management region stores access information of each of blocks in the user data region as a management table. The value of the access information is either a first value indicating that the number of access times is 0 or a second value indicating that the number of access times is greater than or equal to 1. When the value of the access information of the block is the first value, the circuit checks and corrects an error of data read from the block. When the value of the access information of the block is the second value, the circuit does not check and correct an error of data read from the block.

7 Claims, 23 Drawing Sheets

(56) References Cited

U.S. PATENT DOCUMENTS

2010/0107021 A1* 4/2010 Nagadomi .......... G06F 11/1068
　　　　　　　　　　　　　　　　　　　　　　714/704
2011/0271032 A1　11/2011　Yamada et al.
2013/0254463 A1　9/2013　Matsunaga et al.

FOREIGN PATENT DOCUMENTS

| JP | 2011-187950 A | 9/2011 |
| JP | 2011-221996 A | 11/2011 |
| WO | WO-2011/013351 | 2/2011 |

OTHER PUBLICATIONS

Written Opinion (Application No. PCT/IB2016/050865) dated Apr. 26, 2016.

* cited by examiner

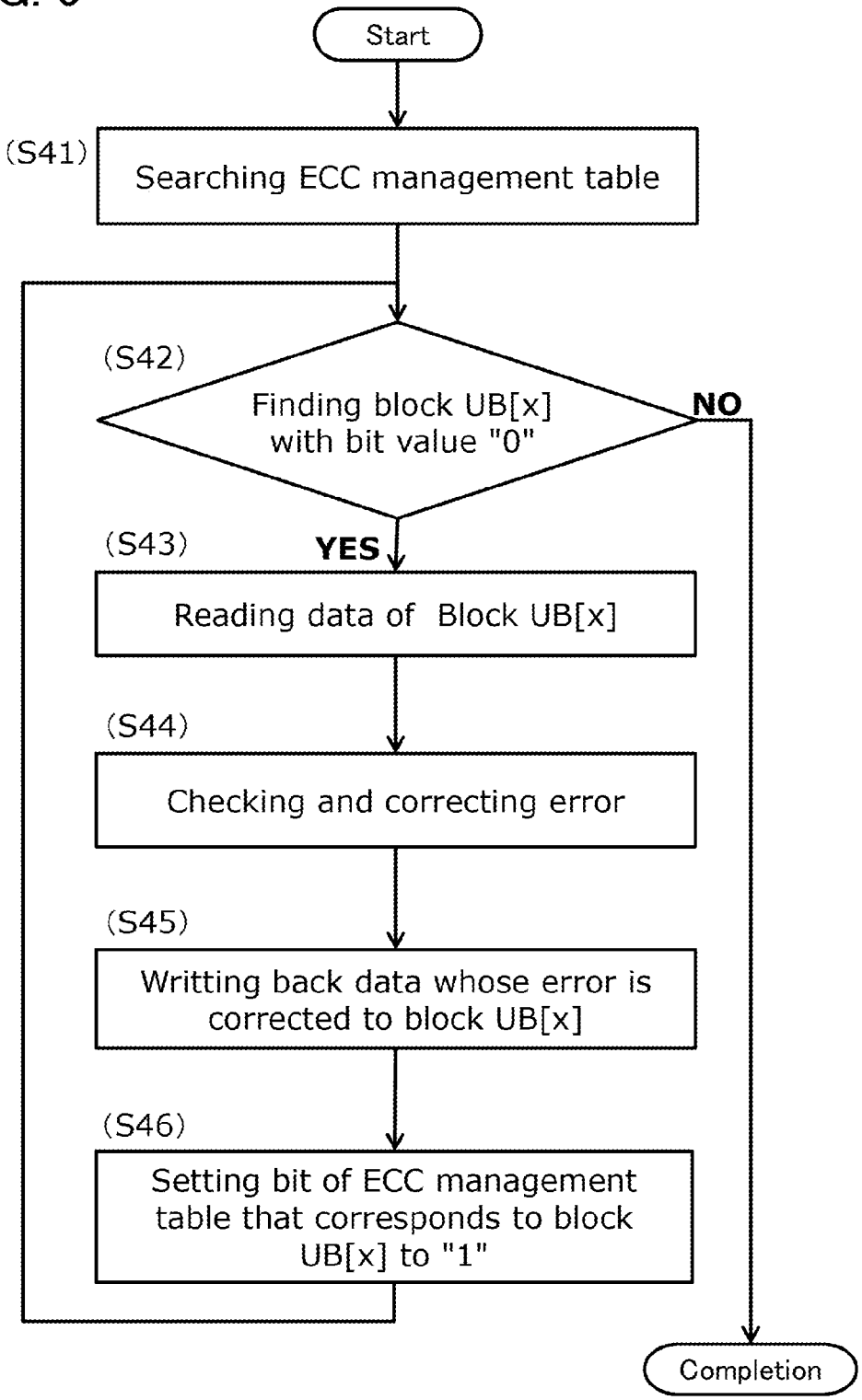

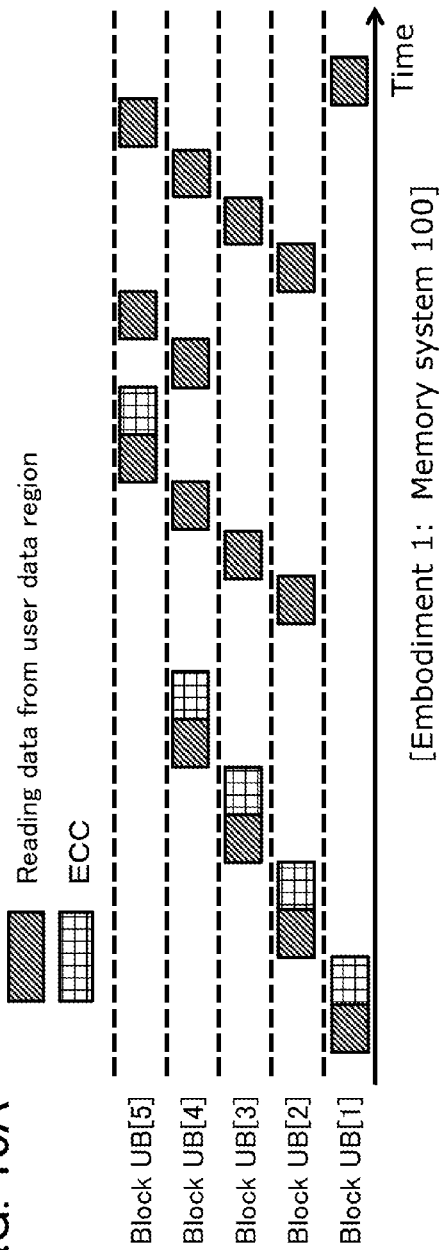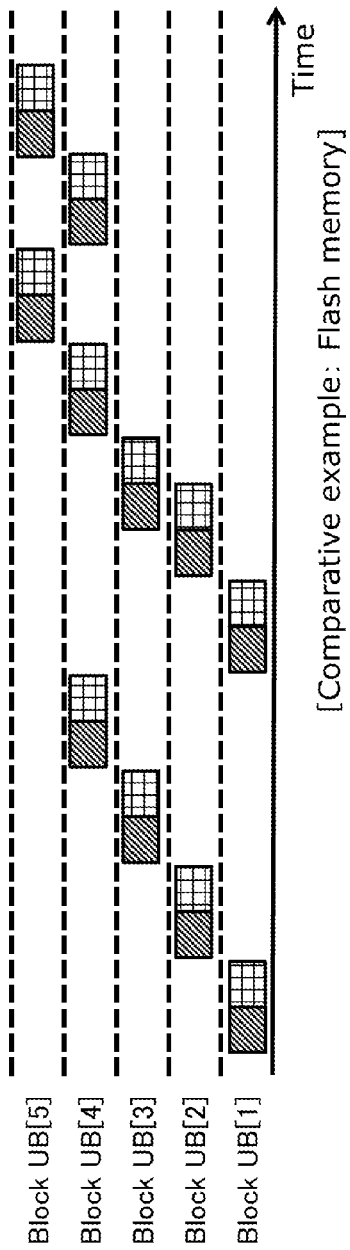

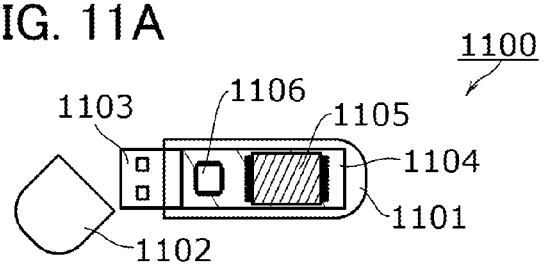
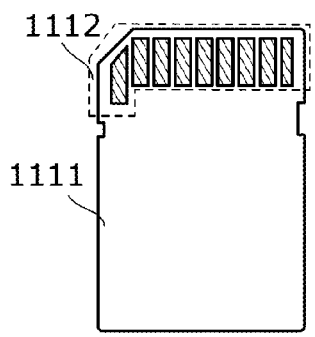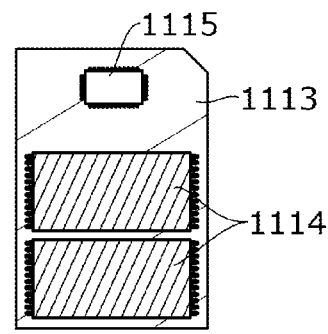
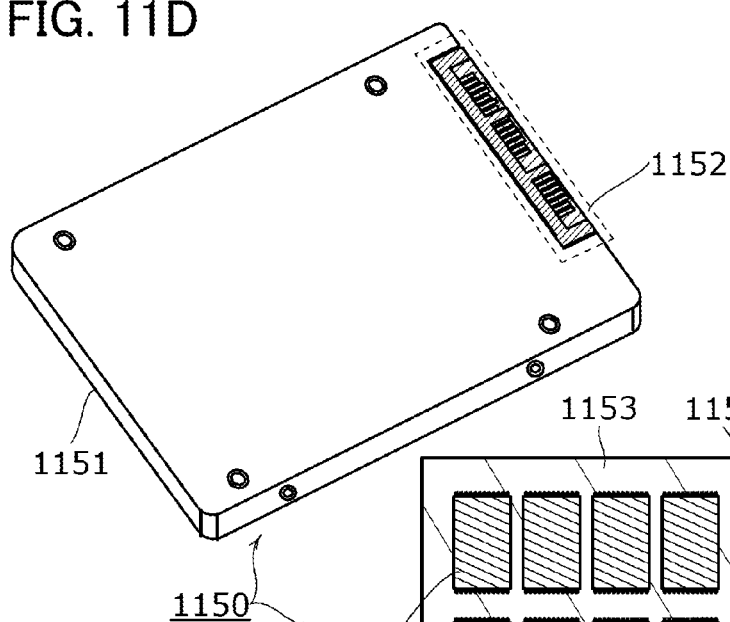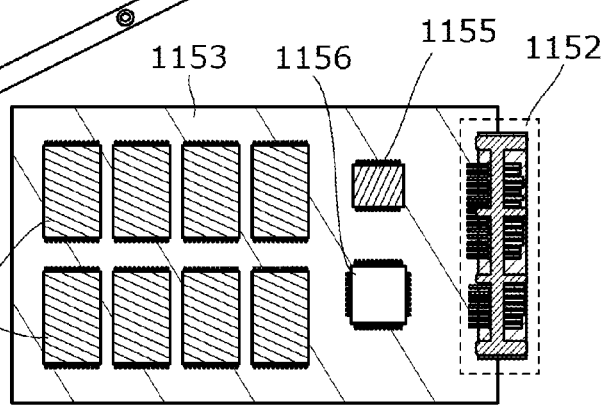

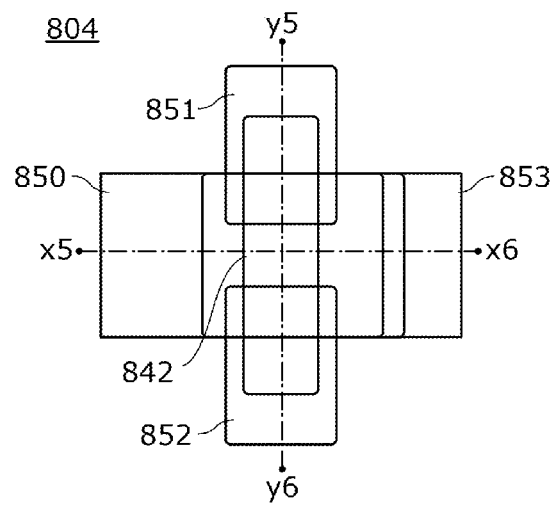
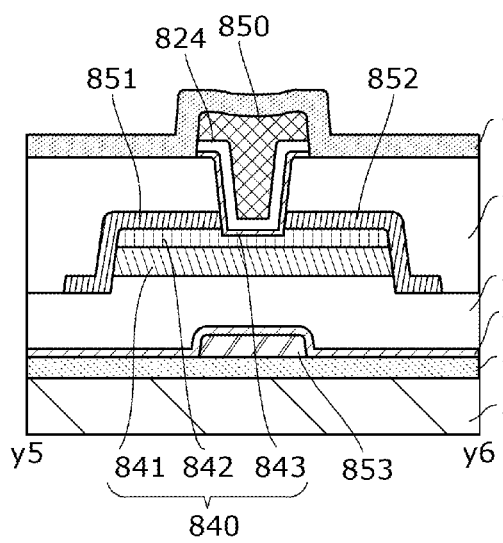
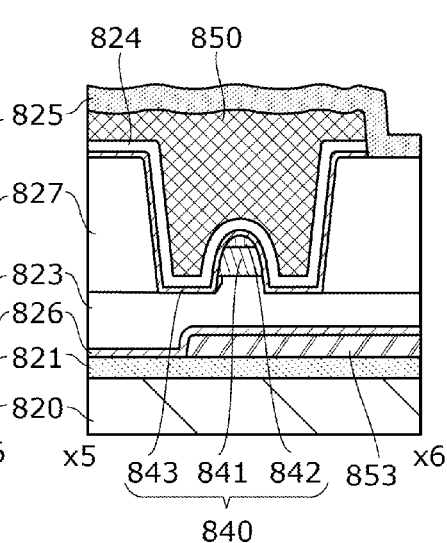

MEMORY SYSTEM AND INFORMATION PROCESSING SYSTEM

TECHNICAL FIELD

The specification, the drawings, and the claims of this application (hereinafter referred to as "this specification and the like") disclose a semiconductor device such as a memory system, an information processing system, an electronic component, or an electronic device, an operating method thereof, a manufacturing method thereof, and the like. Examples of a technical field of one embodiment of the present invention include a storage device, a processing unit, a display device, a liquid crystal display device, a light-emitting device, a lighting device, a power storage device, an input device, an imaging device, a switch circuit (e.g., a power switch and a wiring switch), a driving method thereof, and a manufacturing method thereof.

In this specification and the like, a semiconductor device refers to a device that utilizes semiconductor characteristics, and means a circuit including a semiconductor element (e.g., a transistor, a diode, or a photodiode), a device including the circuit, and the like. The semiconductor device also means any device that can function by utilizing semiconductor characteristics. For example, an integrated circuit, a chip including an integrated circuit, and an electronic component including a chip in a package are examples of semiconductor devices. Moreover, a storage device, a display device, a light-emitting device, a lighting device, an electronic device, and the like themselves might be semiconductor devices, or might each include a semiconductor device.

BACKGROUND ART

As memory cells used in random access memories (RAM), 1T1C (one transistor-one capacitor)-type memory cells and 2T-type or 3T-type memory cells are known. These memory cells store data by charging and discharging retention nodes with write transistors.

It has been proposed that a transistor whose channel formation region is formed using an oxide semiconductor (hereinafter also referred to as an oxide semiconductor transistor or an OS transistor) is employed as a write transistor in these memory cells. For example, Patent Document 1 discloses a memory cell that can retain data even in the situation in which power is not supplied, by including the OS transistor as a write transistor. A memory including an OS transistor can be used as a nonvolatile memory.

As an example of a nonvolatile memory, a flash memory is known. There is an upper limit of the cycling capability of the flash memory, which is generally about $1 \times 10^5$ times. As the cycling capability of the flash memory increases, the rate of error occurrence at the time of access increases; thus, the cycling capability of the flash memory greatly affects the lifetime of the flash memory. In order to extend the lifetime of the flash memory, an error check and correct (ECC) circuit is widely used in the flash memory to correct data of a failure bit (for example, see Patent Document 2). As the number of bits in one block of the flash memory becomes larger, the number of redundant bits needed to correct an error becomes relatively smaller; thus, the utilization efficiency of a storage region increases. In general, a memory is accessed in blocks of several tens of bits to several tens of thousands of bits to perform ECC.

REFERENCES

Patent Document 1: Japanese Published Patent Application No. 2011-187950

Patent Document 2: Japanese Published Patent Application No. 2011-221996

DISCLOSURE OF INVENTION

As the number of bits in one block of a flash memory becomes larger, the ECC time becomes longer; thus, the flash memory access time becomes longer. In addition, the size of a logic circuit that controls the flash memory becomes larger, and power consumption becomes higher.

In view of the above, an object of one embodiment of the present invention is to increase access speed or to reduce power consumption. Another object of one embodiment of the present invention is to provide a novel memory system including an OS transistor or an operating method thereof. Another object of one embodiment of the present invention is to provide a novel semiconductor device or an operating method thereof.

Note that the description of a plurality of objects does not disturb the existence of each object. One embodiment of the present invention does not necessarily achieve all the objects described above. Other objects will be apparent from and can be derived from the description of the specification, the drawings, the claims, and the like, and such objects could be objects of one embodiment of the present invention.

One embodiment of the present invention is a memory system that includes a memory, a circuit, and a processor. The memory includes a user data region and a management region. The user data region is divided into a plurality of blocks. The circuit has a function of checking and correcting an error of data read from the block. The management region stores access information of each of the plurality of blocks as a management table. The value of the access information is either a first value indicating that the number of access times is 0 or a second value indicating that the number of access times is greater than or equal to 1. The processor has a function of determining the value of the access information, a function of controlling writing and reading of the management region, a function of controlling writing and reading of the user data region, and a function of controlling the circuit. When the value of the access information of the block is the second value, the processor controls the circuit so that the circuit does not check and correct an error of data read from the block.

In the above embodiment, when the circuit checks and corrects an error, the processor may control the circuit so that the value of the access information of the block is the second value. Alternatively, when power is turned on, the processor may control the circuit so that the management table is initialized to the first value. Alternatively, if there is a block in which the value of the access information is the first value when power is turned off, the processor may control the circuit so that the circuit checks and corrects an error of data read from the block.

In the above embodiment, the memory includes a plurality of memory cells. The memory cell includes a retention node and a transistor capable of controlling charging and discharging of the retention node. A channel formation region of the transistor may be formed using a metal oxide.

In this specification and the like, description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Each of X and Y denotes an object (e.g., a device, an element, a circuit, a wiring, an electrode, a terminal, a conductive film, or a layer).

A transistor is an element having three terminals: a gate, a source, and a drain. The gate functions as a control terminal for controlling electrical continuity of the transistor. Depending on the type of the transistor or levels of potentials applied to the terminals, one of two input/output terminals functions as a source and the other functions as a drain. Therefore, the terms "source" and "drain" can be interchanged with each other in this specification and the like. In this specification and the like, two terminals except a gate are referred to as a first terminal and a second terminal in some cases.

A node can be referred to as a terminal, a wiring, an electrode, a conductive layer, a conductor, an impurity region, or the like depending on a circuit structure, a device structure, and the like. Furthermore, a terminal, a wiring, or the like can be referred to as a node.

Note that voltage refers to a potential difference between a given potential and a reference potential (e.g., a ground potential (GND) or a source potential) in many cases. Voltage can be referred to as a potential. Note that a potential has a relative value. Accordingly, GND does not necessarily mean 0 V.

In this specification and the like, ordinal numbers such as "first," "second," and "third" are used to show the order in some cases. Alternatively, ordinal numbers such as "first," "second," and "third" are used to avoid confusion among components in some cases, and do not limit the number of components or do not limit the order. For example, it is possible to replace the term "first" with the term "second" or "third" in describing one embodiment of the present invention.

In this specification and the like, the terms "film" and "layer" can be interchanged with each other depending on circumstances or conditions. For example, the term "conductive layer" can be changed into the term "conductive film" in some cases. The term "insulating film" can be changed into the term "insulating layer" in some cases, for example.

In the drawings, the size, thickness, length, or the like of a structure is exaggerated for clarity or for convenience of description in some cases. The drawings are schematic views showing ideal examples, and embodiments of the present invention are not limited to shapes or values shown in the drawings. For example, the following can be included in the drawings: variation in voltage or current due to noise or a difference in timing.

In addition, circuit arrangement and circuit structures in one embodiment of the present invention are not limited to those described in block diagrams. Processing to be performed by a plurality of circuit blocks in the block diagram may be achieved by one circuit in an actual semiconductor device. Processing to be performed by one circuit block in the block diagram may be achieved by a plurality of circuits in an actual semiconductor device.

The positional relationship between components is changed as appropriate in accordance with a direction in which the components are illustrated. Therefore, terms for describing positional relationship, such as "over" and "under," are used for convenience in some cases in order to describe one embodiment of the present invention with reference to drawings. Thus, there is no limitation to the description in this specification and the like, and the positional relationship between the components can be restated appropriately depending on the situation.

According to one embodiment of the present invention, it is possible to increase access speed or to reduce power consumption. According to one embodiment of the present invention, it is possible to provide a novel memory system including an OS transistor or an operating method thereof. According to one embodiment of the present invention, it is possible to provide a novel semiconductor device or an operating method thereof.

The description of the plurality of effects does not disturb the existence of other effects. In one embodiment of the present invention, there is no need to obtain all the effects described above. In one embodiment of the present invention, other objects, effects, and novel features will be apparent from the description of the specification and the drawings.

BRIEF DESCRIPTION OF DRAWINGS

In the accompanying drawings:

FIG. 9 is a flow chart illustrating an operation example of the memory system;

FIG. 10A schematically illustrates an operation example of the memory system in Embodiment 1, and FIG. 10B schematically illustrates an operation example of the memory system in a comparative example;

FIGS. 11A to 11E are schematic diagrams each illustrating a structure example of a removable storage device;

FIG. 18A is a top view illustrating a structure example of a transistor, FIG. 18B is a cross-sectional view of the transistor taken along line y5-y6 in FIG. 18A, and FIG. 18C is a cross-sectional view of the transistor taken along line x5-x6 in FIG. 18A;

BEST MODE FOR CARRYING OUT THE INVENTION

Figure 1:
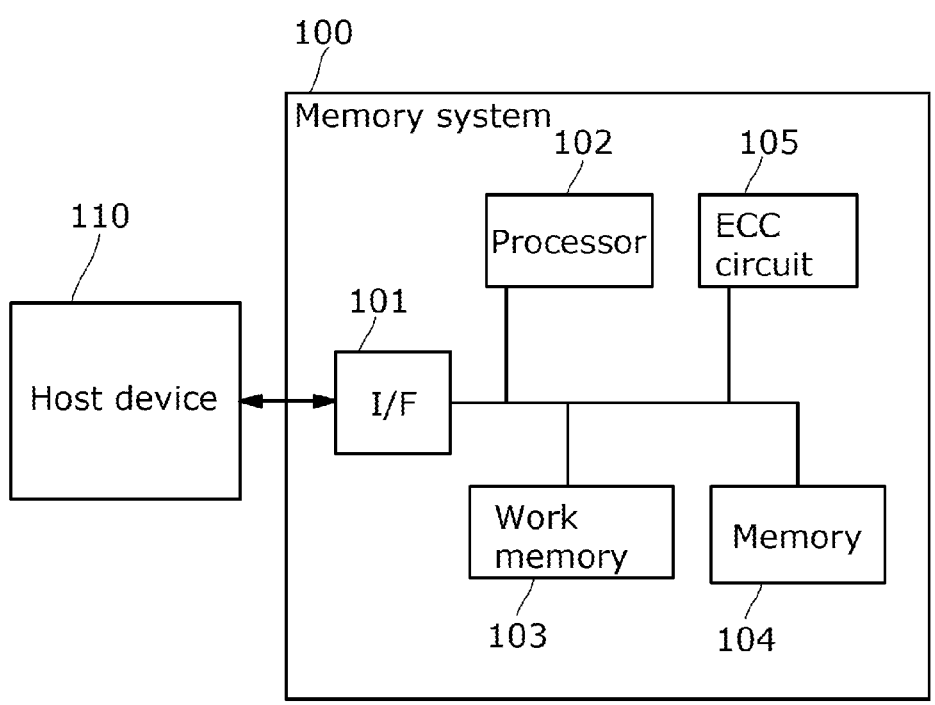
FIG. 1 is a block diagram illustrating a structure example of a memory system.

Embodiments of the present invention will be described below. Note that one embodiment of the present invention is not limited to the following description. It will be readily appreciated by those skilled in the art that modes and details of the present invention can be modified in various ways without departing from the spirit and scope of the present invention. One embodiment of the present invention therefore should not be construed as being limited to the following description of the embodiments.

Any of the embodiments described below can be combined as appropriate. In addition, in the case where a plurality of structure examples (including a manufacturing method example, an operating method example, and the like) are given in one embodiment, any of the structure examples can be combined as appropriate, and any of the structure examples can be combined with one or more structure examples described in the other embodiments.

In the drawings, the same components, components having similar functions, components formed using the same material, or components formed at the same time are denoted by the same reference numerals, and the description thereof is not repeated in some cases.

When the same reference numerals need to be distinguished from each other, a symbol for identification, such as "_1," "_2," "<j>," or "[i]," is added to the reference numerals in some cases. For example, to distinguish a plurality of wirings WL from each other, the wiring WL in a second row is sometimes described as a wiring WL_2 using an address number (row number).

In this specification, a high power supply potential VDD is abbreviated to "a potential VDD," "VDD," or the like in some cases. The same applies to other components (e.g., signals, voltages, potentials, circuits, elements, electrodes, and wirings).

Embodiment 1

In this embodiment, a memory system including an OS transistor, an operating method thereof, and the like are described.

<<Structure Example of Memory System>>

FIG. 1 is a block diagram illustrating a structure example of a memory system. A memory system 100 has a function of writing and reading data in accordance with an access request from a host device 110. The memory system 100 includes an interface (I/F) 101, a processor 102, a work memory 103, a memory 104, and an ECC circuit 105.

The I/F 101 is an interface for communication with the host device 110. The processor 102 controls the entire operation of the memory system 100. The work memory 103 is a memory for temporarily storing data needed to execute processing by the processor 102. The work memory 103 can be, for example, a memory such as an SRAM or a DRAM.

The memory 104 includes a memory cell including an OS transistor. The ECC circuit 105 is a circuit for checking and correcting an error of the memory 104. For example, the ECC circuit 105 has a function of correcting an error by a BCH code, a Reed-Solomon code, a CRC code, or the like.

<Structure of Memory 104>

Figure 2:
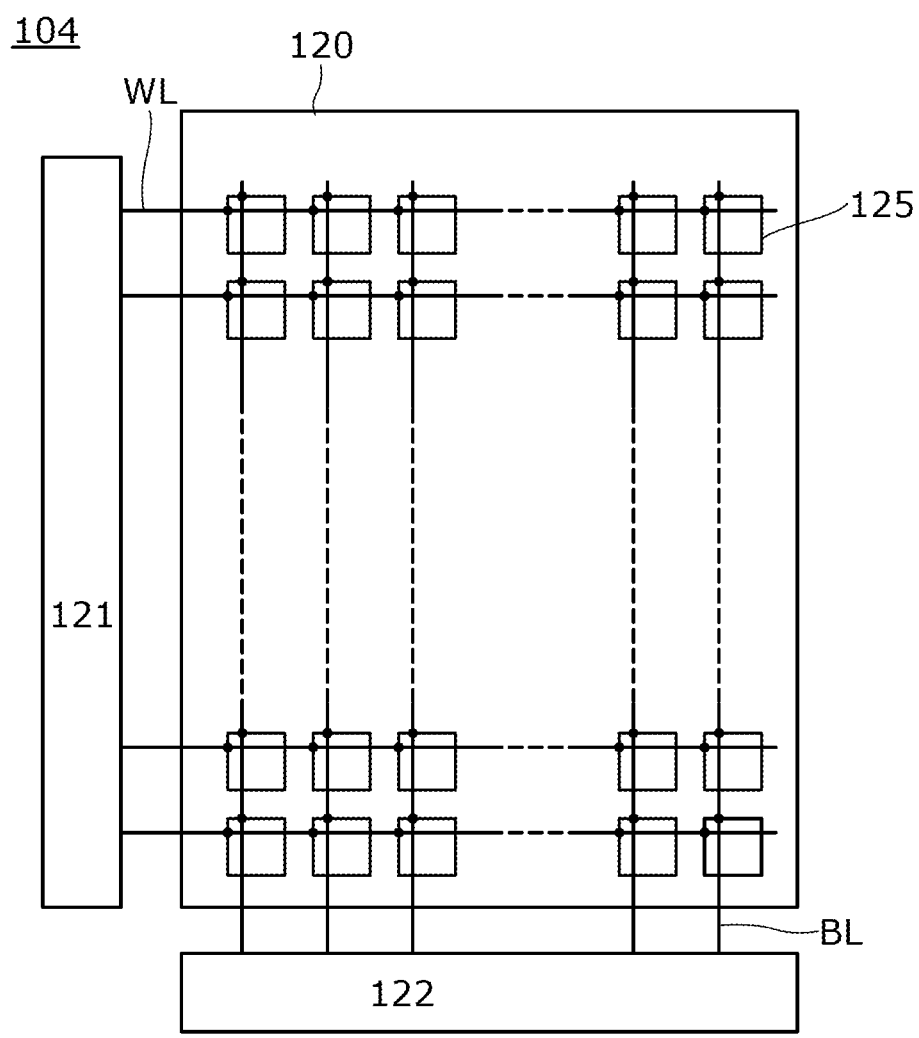
FIG. 2 is a block diagram illustrating a structure example of a memory.

FIG. 2 is a block diagram illustrating a structure example of the memory 104. The memory 104 includes a memory cell array 120, a row driver 121, and a column driver 122. The memory cell array 120 includes memory cells 125, wirings WL, and wirings BL. A plurality of memory cells 125 are arranged in a matrix. The memory cells 125 in one row are electrically connected to the wiring WL in the row. The memory cells 125 in one column are electrically connected to the wiring BL in the column.

The wiring WL can function as a word line. The wiring WL is electrically connected to the row driver 121. The row driver 121 has a function of outputting a signal for selecting the memory cell 125 to which access is requested to the wiring WL. The wiring BL can function as a bit line. The wiring BL is electrically connected to the column driver 122. The column driver 122 has a function of conditioning (e.g., precharging) the bit line, a function of writing data to the selected memory cell 125, and a function of reading the data from the memory cell 125. Depending on the circuit structure of the memory cell array 120 and an operating method thereof, other functions are added to the row driver 121 and the column driver 122 or functions that are unnecessary for operation are eliminated from the row driver 121 and the column driver 122.

<Memory Cell>

FIGS. 3A to 3G each illustrate a circuit structure example of a memory cell. Memory cells 151 to 155 in FIGS. 3A to 3G can be applied to the memory cells 125, and write transistors are OS transistors. Since the OS transistor has extremely low off-state current, the memory cells 151 to 155 in FIGS. 3A to 3G function as nonvolatile memory devices.

Here, off-state current refers to current that flows between a source and a drain when a transistor is off. For example, when the transistor is an n-channel transistor with a threshold voltage of approximately 0 to 2 V, current that flows between the source and the drain when voltage between the gate and the source is negative can be referred to as off-state current. Extremely low off-state current means, for example, that off-state current per micrometer of channel width is lower than or equal to 100 zA (z represents zepto and denotes a factor of $10^{-21}$). Since the off-state current is preferably as low as possible, the normalized off-state current is preferably lower than or equal to 10 zA/μm or lower than or equal to 1 zA/μm, more preferably lower than or equal to 10 yA/μm (y represents yocto and denotes a factor of $10^{-24}$).

An oxide semiconductor has a bandgap of 3.0 eV or higher; thus, an OS transistor has low leakage current due to thermal excitation and, as described above, extremely low off-state current. A channel formation region of an OS transistor is preferably formed using an oxide semiconductor containing at least one of indium (In) and zinc (Zn). Typical examples of such an oxide semiconductor include an In-M-Zn oxide (M is Al, Ga, Y, or Sn, for example). By reducing impurities serving as electron donors, such as moisture or hydrogen, and also reducing oxygen vacancies, an i-type (intrinsic) or substantially i-type oxide semiconductor can be obtained. Here, such an oxide semiconductor can be referred to as a highly purified oxide semiconductor. By using a highly purified oxide semiconductor, the off-state current of the OS transistor that is normalized by channel width can be as low as several yoctoamperes per micrometer to several zeptoamperes per micrometer. An OS transistor and an oxide semiconductor will be described in Embodiments 4 and 5.

(1T1C)

Figure 3A:
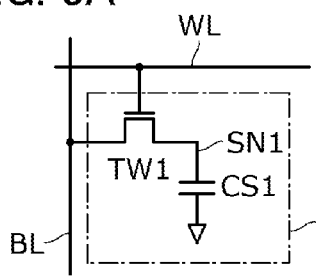
FIGS. 3A to 3G are circuit diagrams each illustrating a structure example of a memory cell.

The memory cell 151 in FIG. 3A is a 1T1C memory cell, which includes a node SN1, a transistor TW1, and a capacitor CS1. The node SN1 is a retention node. The capacitor CS1 is a storage capacitor for holding charge of the node SN1. The transistor TW1 is a write transistor (OS transistor). The transistor TW1 has a function of controlling electrical continuity between the wiring BL and the node SN1. A gate of the transistor TW1 is electrically connected to the wiring WL.

By turning off the transistor TW1, the node SN1 is brought into an electrically floating state and the memory cell 151 retains data. Since the transistor TW1 is an OS transistor, leakage of charge from the node SN1 is reduced, so that the memory cell 151 can retain data for a long time.

Figure 3B:
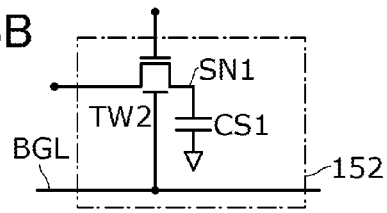
Figure 3C:
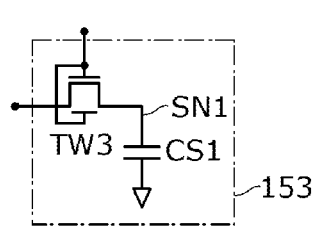

As illustrated in FIGS. 3B and 3C, transistors TW2 and TW3 with back gates can be used as write transistors. The transistors TW2 and TW3 are also OS transistors.

The back gate of the transistor TW2 in the memory cell 152 in FIG. 3B is electrically connected to a wiring BGL. The threshold voltage of the transistor TW2 can be controlled by the potential of the wiring BGL. In the case where a charge accumulation layer is provided as an insulating layer between the back gate and a channel formation region of the transistor TW2, charge can be injected into a charge accumulation layer of the transistor TW2 by using the wiring BGL at the time of manufacture of the memory cell 152. In the case of performing this step, the back gate of the transistor TW2 may be brought into an electrically floating state to operate the memory cell 152 without controlling the potential of the wiring BGL.

In the memory cell 153 in FIG. 3C, the back gate and a gate of the transistor TW3 are electrically connected to each other. When the transistor TW3 has such a device structure, on-state current can be increased. The back gate of the transistor TW3 may be electrically connected to any of a gate, a source, or a drain of the transistor TW3.

(2T)

Figure 3D:
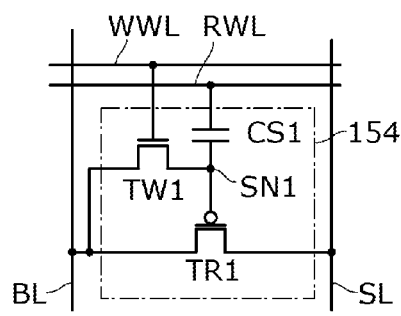

The memory cell 154 in FIG. 3D is a 2T memory cell and is electrically connected to wirings WWL, RWL, BL, and SL. The wiring WWL is a write word line, and the wiring RWL is a read word line. Signals are input from the row driver 121 to the wirings WWL and RWL. Signals are input from the column driver 122 to the wiring SL.

The memory cell 154 includes the node SN1, the capacitor CS1, the transistor TW1, and a transistor TR1. The transistor TR1 is a read transistor and controls electrical continuity between the wiring BL and the wiring SL. The gate of the transistor TW1 is electrically connected to the wiring WWL. The capacitor CS1 is electrically connected to the node SN1 and the wiring RWL. A constant potential may be input to the wiring RWL, or the potential of the wiring RWL may be controlled in accordance with a selected or non-selected state of the memory cell 154.

Figure 3E:
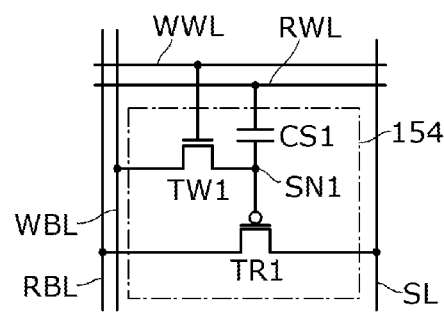

In the case of using the memory cell 154, bit lines (the wirings BL) can be separated into a write bit line (a wiring WBL) and a read bit line (a wiring RBL), as illustrated in FIG. 3E. In that case, the transistor TW1 controls electrical continuity between the wiring WWL and the node SN1, and the transistor TR1 controls electrical continuity between the wiring RWL and the wiring SL.

In the memory cell 154, the transistor TW1 may be replaced with the transistor TW2 or TW3. In addition, the transistor TR1 may be an n-channel transistor.

(3T)

Figure 3F:
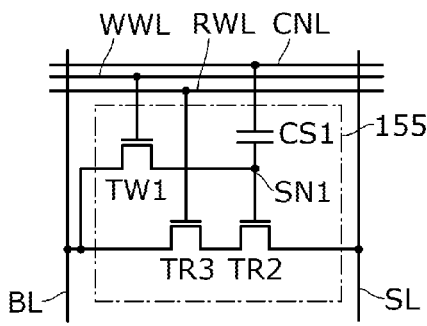

The memory cell 155 in FIG. 3F is a 3T memory cell and is electrically connected to the wirings WWL, RWL, BL, and SL, and a wiring CNL. The memory cell 155 includes the node SN1, the capacitor CS1, the transistor TW1, a transistor TR2, and a transistor TR3. The capacitor CS1 is capacitively coupled between the node SN1 and the wiring CNL. A fixed potential may be input to the wiring CNL, or the potential of the wiring CNL may be controlled in accordance with a selected or non-selected state of the memory cell 155. The transistors TR2 and TR3 are electrically connected in series between the wiring BL and the wiring SL. A gate of the transistor TR2 is electrically connected to the node SN1, and a gate of the transistor TR3 is electrically connected to the wiring RWL.

Figure 3G:
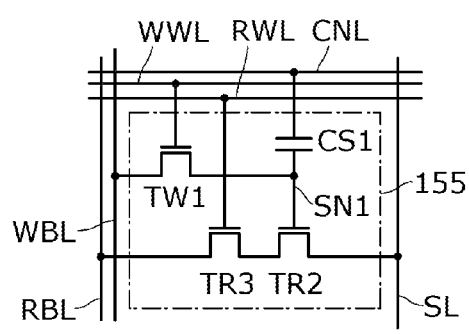

In the case of using the memory cell 155, bit lines (the wirings BL) can be separated into a write bit line (the wiring WBL) and a read bit line (the wiring RBL), as illustrated in FIG. 3G. In that case, the transistor TW1 controls electrical continuity between the wiring WWL and the node SN1, and the transistors TR2 and TR3 are electrically connected in series between the wiring RBL and the wiring SL.

In the memory cell 155, the transistor TW1 may be replaced with the transistor TW2 or TW3. In addition, the transistors TR2 and TR3 may be p-channel transistors.

The transistor TR1 in the memory cell 154 and the transistors TR2 and TR3 in the memory cell 155 are not particularly limited, and can be Si transistors formed using a silicon wafer, for example. In the case where the transistors TR1 to TR3 are n-channel transistors, the transistors TR1 to TR3 may be OS transistors.

<Operation Example of Memory Cell>

Figure 4:
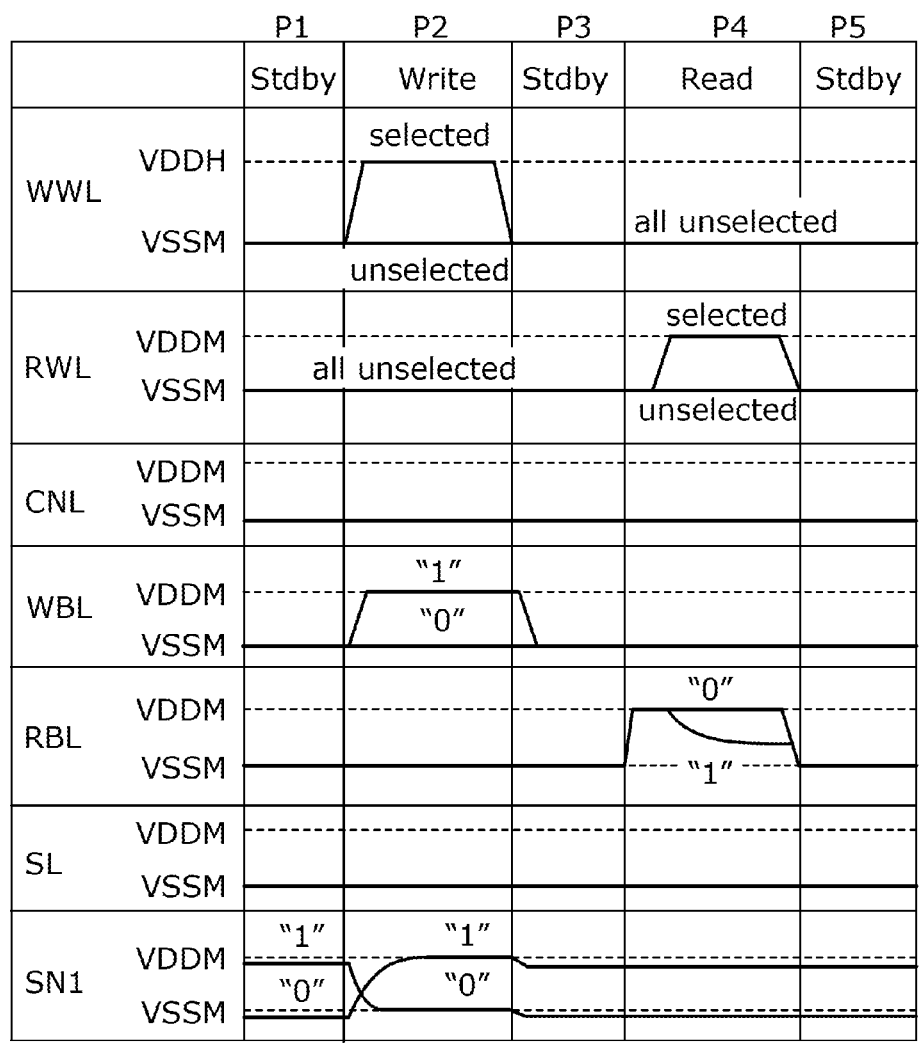
FIG. 4 is a timing chart illustrating an example of an operating method of the memory cell.

Here, an example of a driving method of the memory cell 155 is described. FIG. 4 is a timing chart illustrating an operation example of the memory cell 155. In FIG. 4, the low (L) potentials of the wirings WWL, RWL, WBL, RBL, SL, and CNL are VSSM. VSSM may be a ground potential (GND) or 0 V. The high (H) potential of the wiring WWL is VDDH, and the high (H) potentials of the wirings RWL, WBL, RBL, SL, and CNL are VDDM. Here, the threshold voltage of the transistor TW1 is higher than those of the transistors TR2 and TR3; thus, VDDH is higher than VDDM.

Periods P1, P3, and P5 are standby (Stdby) periods. In the periods P1, P3, and P5, the wirings RWL, WWL, CNL, RBL, and SL are set at an L level. The memory cells 155 in all the rows are unselected. Here, the storage capacity of the memory cell 155 is one bit. In the period P1, the node SN1 that retains "1" is at an H level, and the node SN1 that retains "0" is at an L level.

<Write Operation>

A period P2 is a write period. The wiring WWL in a selected row is set at an H level, so that the transistor TW1 is turned on. In the case where "1" is written to the memory cell 155, the wiring WBL is set at an H level. In the case where "0" is written to the memory cell 155, the wiring WBL is set at an L level. In the selected memory cell 155, the potential of the node SN1 becomes VDDM or VSSM depending on the potential of the wiring WBL.

Next, the wiring WWL is set at an L level, so that the transistor TW1 is turned off. The node SN1 is brought into an electrically floating state, and the memory cell 155 retains data. Note that the wiring WWL and the node SN1 are capacitively coupled; thus, by turning off the transistor TW1, the potential of the node SN1 is slightly decreased. By setting the wiring WBL at an L level, the write operation is terminated. By setting the wiring WBL at an L level after bringing the node SN1 into a floating state, fluctuation in the potential of the node SN1 can be reduced.

<Read Operation>

A period P4 is a read period. First, the wiring RBL is precharged to be set at an H level. Next, the wiring RWL in an unselected row is maintained at an L level, and the wiring RWL in a selected row is set at an H level. The transistor TR3 in the selected memory cell 155 is turned on. In the case where the node SN1 retains "0," the transistor TR2 is off, so that the wiring RBL is maintained at an H level. In the case where the node SN1 retains "1," the transistor TR2 is turned on, so that the potential of the wiring RBL is decreased. By setting the wiring RWL at an L level and turning off the transistor TR3, the read operation is terminated. The column driver 122 determines that data read from the memory cell 155 is "0" or "1" based on the potential of the wiring RBL in the period P4.

<<Storage Region of Memory 104>>

Figure 5A:
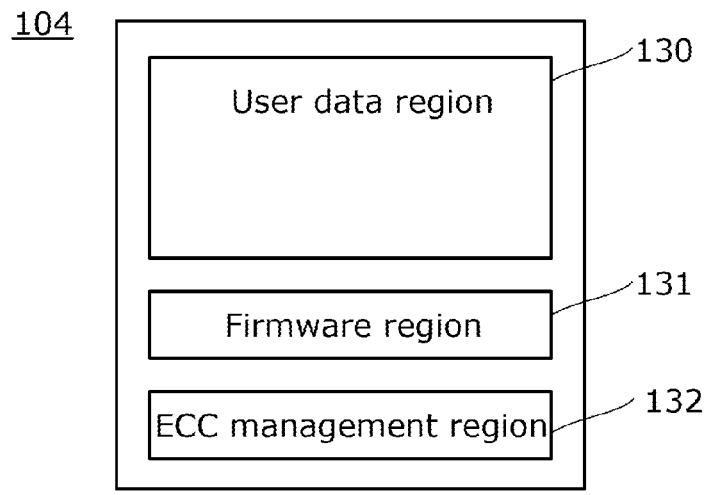
FIG. 5A is a block diagram illustrating a structure example of a memory storage region.

The structure of a storage region of the memory 104 is described with reference to FIGS. 5A to 5C. FIG. 5A illustrates a structure example of the storage region of the memory 104. The memory 104 includes a user data region 130, a firmware region 131, and an ECC management region 132.

The user data region 130 is a data region that can be accessed by the host device 110. Data is written to the user data region 130 by write access of the host device 110. Data stored in the user data region 130 is read by read access of the host device 110.

Figure 5B:
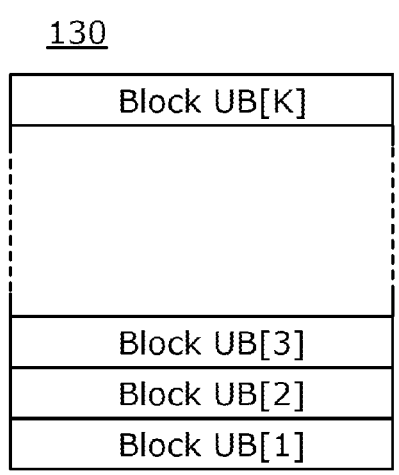
FIG. 5B is a schematic diagram illustrating a structure example of a user data region.

FIG. 5B schematically illustrates the structure of the user data region 130. The user data region 130 is divided into a plurality of blocks (fundamental units). The host device 110 accesses the user data region 130 in blocks. Here, the block of the user data region 130 is referred to as a block UB. For example, the user data region 130 in FIG. 5B includes a plurality of blocks UB (UB[1] to UB[K], where K is an integer of 2 or more). The size of one block UB can be several tens of bits to thousands of bits.

The firmware region 131 is a storage region for storing firmware. The firmware is a program that defines a method for controlling the memory system 100 by the processor 102. In order to process an access request of the host device 110, the processor 102 controls the entire operation of the memory system 100 in accordance with firmware stored in the firmware region 131.

Figure 5C:
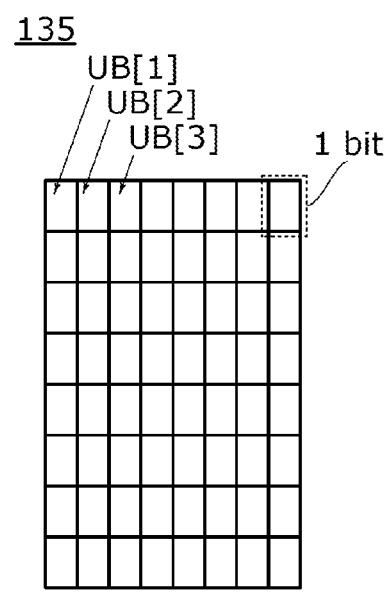
FIG. 5C is a schematic diagram illustrating a structure example of an ECC management table.

The ECC management region 132 is used for an ECC management table 135 (FIG. 5C). The ECC management table 135 stores data on an access history of the blocks UB[1] to UB[K]. In other words, the ECC management table 135 stores data for determining whether ECC is needed or not in relation to the blocks UB[1] to UB[K].

FIG. 5C illustrates an example of the ECC management table 135. The ECC management table 135 stores 1-bit data of each block UB. In addition, "0" indicates that the number of access times after power-on is 0 and that ECC is needed. Furthermore, "1" indicates that the number of access times after power-on is greater than or equal to 1 and that ECC is not needed.

Note that in the ECC management table 135, 1-bit block is assigned in each block UB; however, a block of 2 bits or more can be assigned in each block UB. The bit size of the ECC management table 135 is preferably as small as possible because the user data region 130 can be made larger.

The memory cell 125 does not deteriorate in principle because it stores data by charging and discharging of the retention node. Therefore, the memory 104 is less likely to cause an error due to deterioration than a flash memory.

Since the OS transistor is used as the write transistor, the memory cell 125 has high soft error tolerance. Accordingly, the memory system 100 decreases the need to correct an error every read access. On the other hand, even in the memory 104, the error occurrence rate might become higher because retention time becomes longer due to variation in element electrical characteristics, for example. Consequently, error correction is very effective in improving retention characteristics and reliability of the memory 104.

Therefore, in this embodiment, the memory system 100 is constructed in such a manner that it can determine whether error correction by the ECC circuit 105 is needed or not by using the ECC management table 135, reliability and execution speed are secured or reliability and power reduction are secured. This is described below by showing an operation example of the memory system 100.

<<Operation Example of Memory System>>

The operation example of the memory system 100 is described with reference to FIG. 6, FIG. 7, FIG. 8, FIG. 9, and FIGS. 10A and 10B. Operation shown in each flow chart is defined by firmware stored in the firmware region 131. Each circuit of the memory system 100 operates in such a manner that defined processing is executed after the processor 102 executes the firmware.

<Power-On>

Figure 6:
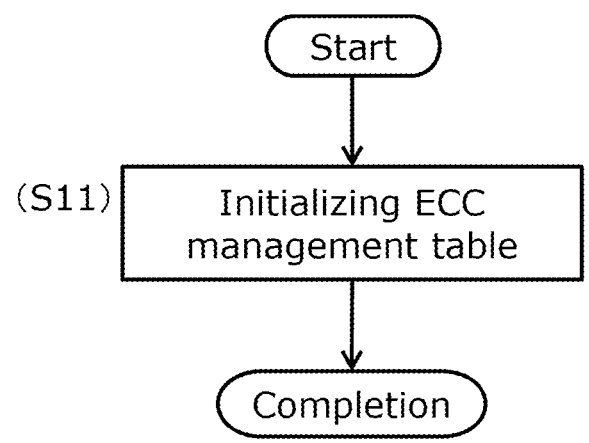
FIG. 6 is a flow chart illustrating an operation example of the memory system.

FIG. 6 is a flow chart illustrating an operation example of the memory system 100 when power is turned on. When power is turned on, the processor 102 accesses the memory 104 to initialize all the bits of the ECC management table 135 to "0" (Step S11).

<Write Access>

Figure 7:
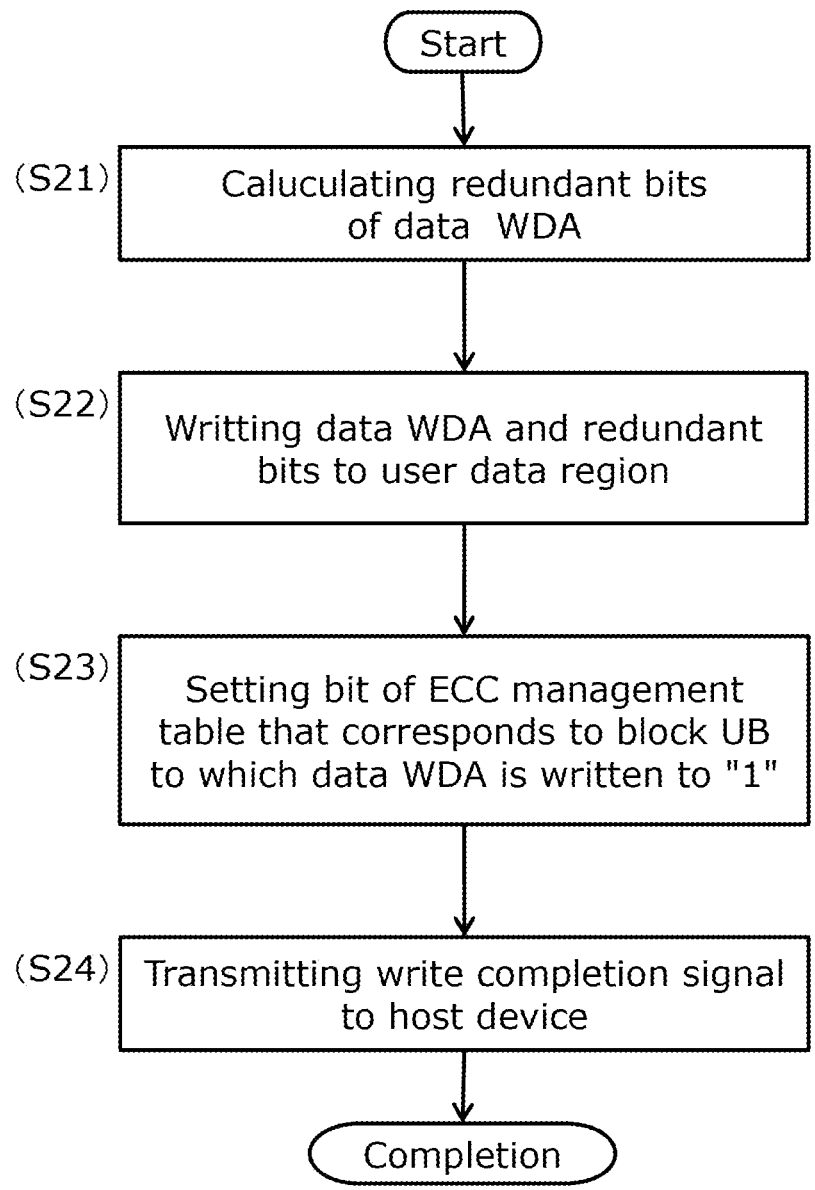
FIG. 7 is a flow chart illustrating an operation example of the memory system.

FIG. 7 is a flow chart illustrating an operation example of the memory system 100 in response to write access of the host device 110. Here, write data transmitted from the host device 110 is referred to as data WDA. When there is a write request, the processor 102 makes the ECC circuit 105 calculate redundant bits of the data WDA (Step S21). Next, the processor 102 controls the memory 104 to update the user data region 130 and the ECC management table 135. The data WDA and the redundant bits obtained in Step S21 are written to the user data region 130 (Step S22). The bit of the ECC management table 135 that corresponds to a block UB to which data is written in Step S22 is set to "1" (Step S23). Finally, the processor 102 transmits a write completion signal to the host device 110 through the I/F 101 (Step S24).

<Read Access>

Figure 8:
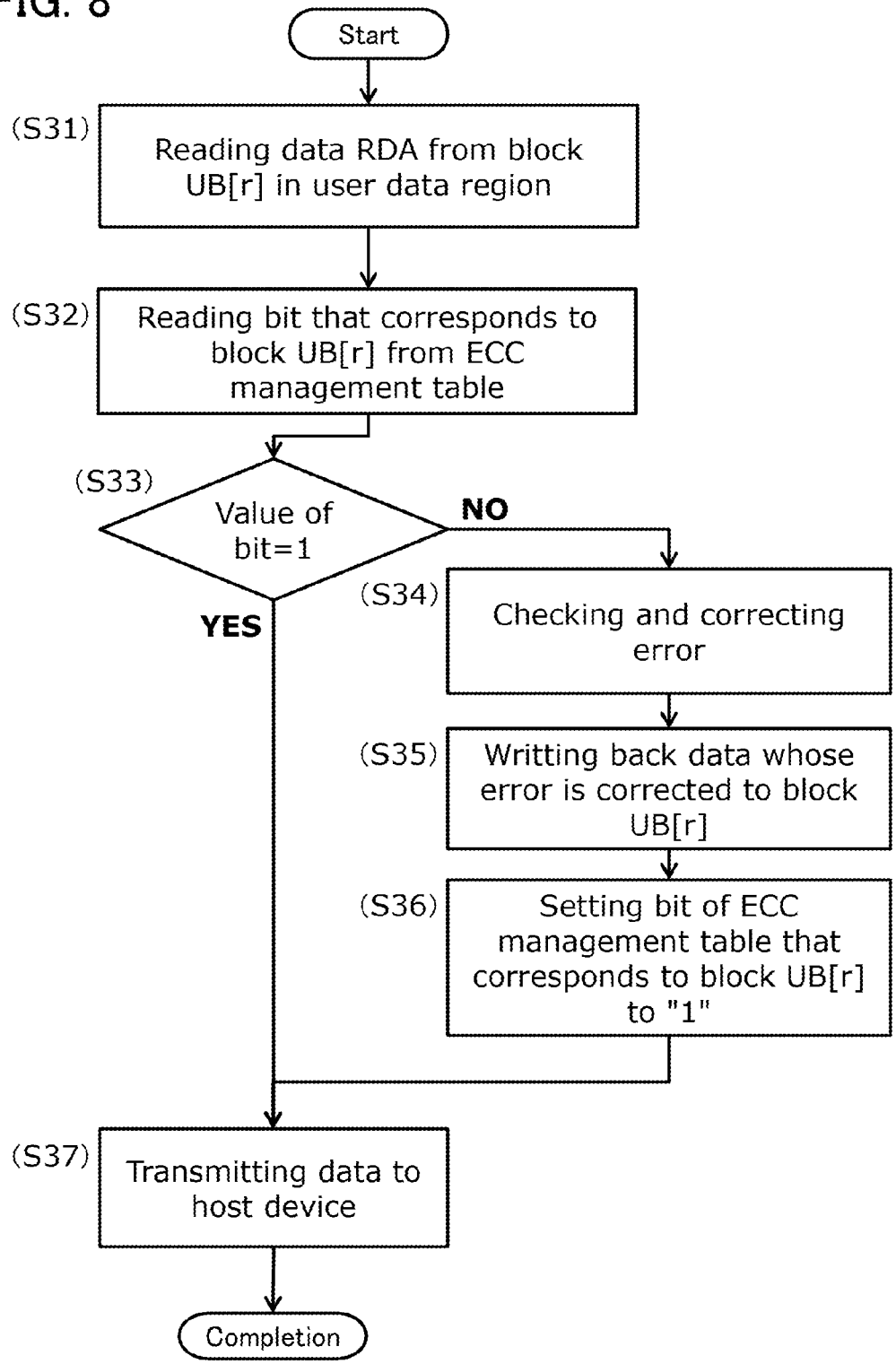
FIG. 8 is a flow chart illustrating an operation example of the memory system.

FIG. 8 is a flow chart illustrating an operation example of the memory system 100 in response to read access of the host device 110. The host device 110 transmits a read request signal and an address to the I/F 101. When the read request signal is received, the processor 102 controls the memory 104 to read data from a block UB[r] that is specified by the address transmitted from the host device 110 (Step S31), and reads a bit that corresponds to the block UB[r] from the ECC management table 135 (Step S32). Note that r is an integer of 1 or more and K or less.

Next, in Step S32, whether the value of the read bit is "0" or "1" is determined (Step S33). When the value of the bit is "1," data read in Step S32 is transmitted to the host device 110 through the I/F 101 (Step S37) to terminate the operation.

When the value of the bit is not "1," the ECC circuit 105 checks and corrects an error of read data (Step S34). Next, the processor 102 controls the memory 104 to update the user data region 130 and the ECC management table 135. The data whose error is corrected in Step S34 is written back to the block UB[r] (Step S35). The bit of the ECC management table 135 that corresponds to the block UB[r] is set to "1" (Step S36). Finally, data whose error is corrected is transmitted to the host device 110 (Step S37) to terminate the operation.

In other words, in read access of the block UB[r] after the second time, a series of processings for ECC (Steps S34 to S36) is omitted.

In the case where an error of read data is not detected in Step S34, the read data is written back to the block UB[r] in Step S35. That is, through Steps S35 and S36, the accessed block UB[r] is refreshed, so that data retention reliability is increased.

Note that since the memory 104 is less likely to cause an error due to deterioration, in the case where an error is not detected in Step S34, it may be possible not to execute Step S35 but to execute Step S36. This leads to a reduction in access time and power consumption. Consequently, when the memory system 100 is in a power-saving mode or is driven by a battery, the memory system 100 may operate in this manner.

FIG. 10A schematically illustrates an operation example of the memory system 100 in response to read access. FIG. 10B schematically illustrates an operation example of a flash memory as a comparative example. FIGS. 10A and 10B schematically illustrate operations of the memory system 100 and the flash memory in response to read access of the blocks UB[1] to UB[5].

In the flash memory, the blocks UB[1] to UB[5] check and correct errors every read access (FIG. 10B). In contrast, in the memory system 100, the blocks UB[1] to UB[5] check and correct errors in response to first read access of the blocks UB[1] to UB[5], and the blocks UB[1] to UB[5] do not check and correct errors in response to read access after the second time (FIG. 10A). FIGS. 10A and 10B indicate that this embodiment can increase the access speed of the memory system and reduce power consumption.

<Power-Off>

FIG. 9 is a flow chart illustrating an operation example of the processor 102 when the memory system 100 is powered off. In the memory system 100, a block UB in the user data region 130 that has never been accessed is detected by using the ECC management table 135 before turning off power, and the ECC circuit 105 checks and corrects an error of the detected block UB. Thus, the data retention reliability of the memory system 100 is increased.

Before power is turned off, the processor 102 searches the ECC management table 135 to find the block UB[x] with a bit value of "0" (Steps S41 and S42). When the processor 102 does not find the block UB[x], operation is terminated. After that, the memory system 100 is powered off. Note that x is an integer of 1 or more and K or less.

When the processor 102 finds the block UB[x], processing similar to ECC processing in read access (Steps S34 to S36 in FIG. 8) is executed. In other words, data is read from the block UB[x] (Step S43), and an error of the read data is checked and corrected (Step S44). The data whose error is corrected is written back to the block UB[x] (Step S45). The bit of the ECC management table 135 that corresponds to the block UB[x] is set to "1" (Step S46). Until all the bits of the ECC management table 135 are set to "1," Steps S42 to S46 are repeated.

In addition, in the memory system 100, each memory cell 125 included in the ECC management region 132 functions as a circuit for monitoring leakage of the memory cell 125 included in the user data region 130. For example, after "1" is written as the bit of the block UB[1] of the ECC management table 135 for a long time, accumulated charge leaks from the memory cell 125 that forms this bit, and the value of the bit is set to "0" in some cases. This indicates the possibility that data retained in the block UB[1] might have an error. In that case, if there is read access of the block UB[1], the value of the corresponding bit of the ECC management table 135 is "0," and an error of data of the block UB[1] is checked and corrected, so that the reliability of read data is secured.

For example, the memory cell 125 included in the ECC management region 132 and the memory cell 125 included in the user data region 130 may have different element structures so that the amount of charge that leaks from the capacitor CS1 in the memory cell 125 included in the ECC management region 132 is larger than that in the memory cell 125 included in the user data region 130. With such a structure, ECC can be performed with certainty before data stored in the user data region 130 is lost, so that data retention reliability is enhanced.

As described above, in this embodiment, error correction timing and frequency can be optimized. Accordingly, it is possible to increase access speed and reduce power consumption while maintaining data retention reliability.

Embodiment 2

In this embodiment, application examples of the memory system 100 are described. The memory system 100 can be applied to, for example, storage devices of electronic devices (e.g., information terminals, smartphones, e-book readers, digital cameras (including video cameras), video recording/reproducing devices, and navigation systems). Alternatively, the memory system 100 is applied to removable storage devices such as memory cards (e.g., SD cards), USB memories, and solid state drives (SSD). FIGS. 11A to 11E schematically illustrate some structure examples of removable storage devices.

FIG. 11A is a schematic diagram of a USB memory. A USB memory 1100 includes a housing 1101, a cap 1102, a USB connector 1103, and a substrate 1104. The substrate 1104 is held in the housing 1101. The substrate 1104 includes circuits included in the memory system 100. For example, a memory chip 1105 and a controller chip 1106 are attached to the substrate 1104. The memory 104 is incorporated in the memory chip 1105. The processor 102, the work memory 103, the ECC circuit 105, and the like are incorporated in the controller chip 1106. The USB connector 1103 corresponds to the I/F 101.

FIG. 11B is a schematic external diagram of an SD card, and FIG. 11C is a schematic diagram illustrating the internal structure of the SD card. An SD card 1110 includes a housing 1111, a connector 1112, and a substrate 1113. The connector 1112 corresponds to the I/F 101. The substrate 1113 is held in the housing 1111. The substrate 1113 includes circuits included in the memory system 100. For example, a memory chip 1114 and a controller chip 1115 are attached to the substrate 1113. The memory 104 is incorporated in the memory chip 1114. The processor 102, the work memory 103, the ECC circuit 105, and the like are incorporated in the controller chip 1115.

When the memory chip 1114 is also provided on a back side of the substrate 1113, the capacity of the SD card 1110 can be increased. In addition, a wireless chip with a radio communication function may be provided on the substrate 1113. With such a wireless chip, the memory chip 1114 can read and write data by radio communication between the host device 110 and the SD card 1110.

FIG. 11D is a schematic external diagram of an SSD, and FIG. 11E is a schematic diagram illustrating the internal structure of the SSD. An SSD 1150 includes a housing 1151, a connector 1152, and a substrate 1153. The connector 1152 corresponds to the I/F 101. The substrate 1153 is held in the housing 1151. The substrate 1153 includes circuits included in the memory system 100. For example, a memory chip 1154, a memory chip 1155, and a controller chip 1156 are attached to the substrate 1153. The memory 104 is incorporated in the memory chip 1154. When the memory chip 1155 is also provided on a back side of the substrate 1153, the capacity of the SSD 1150 can be increased. The work memory 103 is incorporated in the memory chip 1155. For example, a DRAM chip may be used as the memory chip 1155. The processor 102, the ECC circuit 105, and the like are incorporated in the controller chip 1156. A memory functioning as the work memory 103 may also be provided in the controller chip 1156.

Embodiment 3

In this embodiment, an information processing system in which the host device 110 is combined with the memory system 100 is described.

Figure 12:
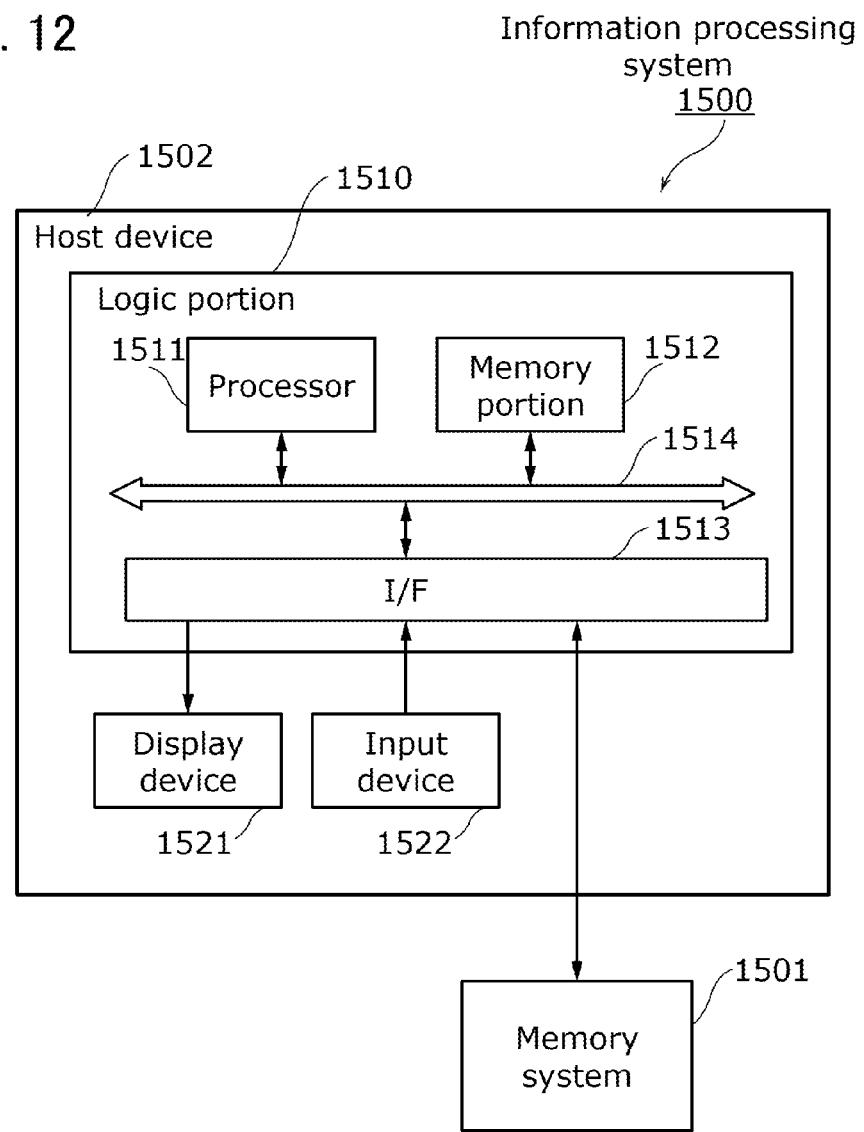
FIG. 12 is a block diagram illustrating a structure example of an information processing system.

FIG. 12 is a block diagram illustrating a structure example of an information processing system. An information processing system 1500 includes a memory system 1501 and a host device 1502.

The memory system 100 in Embodiment 1 can be applied to the memory system 1501. The memory system 1501 is used as, for example, a storage device of the host device 1502 and stores data such as a program, image data, or audio data.

The host device 1502 includes a logic portion 1510, a display device 1521, and an input device 1522.

The logic portion 1510 has a function of controlling the entire host device 1502. The logic portion 1510 includes a processor 1511, a memory portion 1512, an I/F 1513, and a bus 1514. The processor 1511, the memory portion 1512, and the I/F 1513 are connected one another through the bus 1514. The processor 1511 functions as an arithmetic unit and a controller and controls the entire operation of each device in the host device 1502 in accordance with a program such as firmware. A CPU, a microprocessor (MPU), or the like can be used as the processor 1511. The memory portion 1512 stores a program executed by the processor 1511, data processed by the processor 1511, or the like.

The logic portion 1510 communicates with the display device 1521, the input device 1522, and the memory system 1501 through the I/F 1513. For example, an input signal from the input device 1522 is transmitted to the logic portion 1510 through the I/F 1513 and the bus 1514.

The display device 1521 is provided as an output device and constitutes a display portion of the information processing system 1500. The host device 1502 may include another output device such as a speaker or a printer in addition to the display device 1521. Alternatively, the host device 1502 does not necessarily include the display device 1521.

The input device 1522 is a device for inputting data to the logic portion 1510. A user can operate the information processing system 1500 by operating the input device 1522. Various human interfaces can be used as the input device 1522, and the information processing system 1500 may include a plurality of input devices 1522.

A touch sensor, a keyboard, a mouse, an operation button, a microphone (an audio input device), a camera (an imaging system), or the like can be used as the input device 1522. The information processing system 1500 may be operated with devices incorporated in the host device 1502 that detects sound, eye movement, gesture, or the like. For example, in the case where a touch sensor is provided as the input device 1522, this touch sensor may be incorporated in the display device 1521.

In the information processing system 1500, the memory system 1501 and the host device 1502 may be put in one housing or may be formed using a plurality of devices connected to each other with or without a wire. For example, examples of the former include a laptop personal computer (PC), a tablet information terminal, an e-book reader, a smartphone, a cellular phone, an audio terminal, and a video recording/reproducing device. Examples of the latter include a set of a desktop PC, a keyboard, a mouse, and a monitor. In addition, for example, there are an audiovisual (AV) system that includes a video recording/reproducing device, an audio device (e.g., a speaker or an amplifier), and a television set, a monitor system that includes a surveillance camera, a display device, and a video recording storage device.

FIGS. 13A to 13F schematically illustrate some electronic devices as specific examples of the information processing system 1500. The memory system 1501 is mounted on a housing of the information processing system in FIGS. 13A to 13F.

Figure 13A:
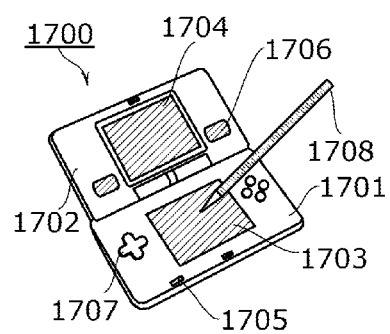
FIGS. 13A to 13F are schematic diagrams each illustrating a structure example of an electronic device.

A portable game machine 1700 in FIG. 13A includes a housing 1701, a housing 1702, a display portion 1703, a display portion 1704, a microphone 1705, speakers 1706, an operation button 1707, and the like.

Figure 13B:
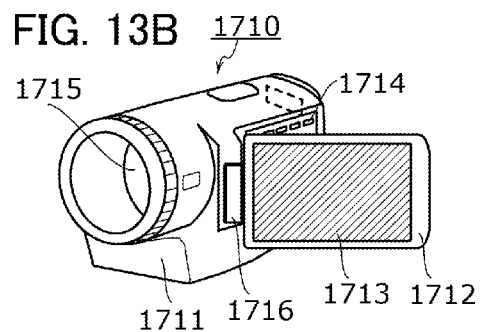

A video camera 1710 in FIG. 13B includes a housing 1711, a housing 1712, a display portion 1713, operation buttons 1714, a lens 1715, a joint 1716, and the like. The operation buttons 1714 and the lens 1715 are provided in the housing 1711, and the display portion 1713 is provided in the housing 1712. The housings 1711 and 1712 are connected to each other with the joint 1716, and an angle between the housings 1711 and 1712 can be changed with the joint 1716. An image on the display portion 1713 may be switched depending on the angle between the housings 1711 and 1712 at the joint 1716.

Figure 13C:
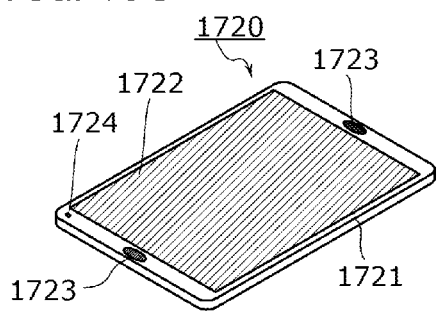

A tablet information terminal 1720 in FIG. 13C includes a display portion 1722 incorporated in a housing 1721, operation buttons 1723, and a speaker 1724.

Figure 13D:
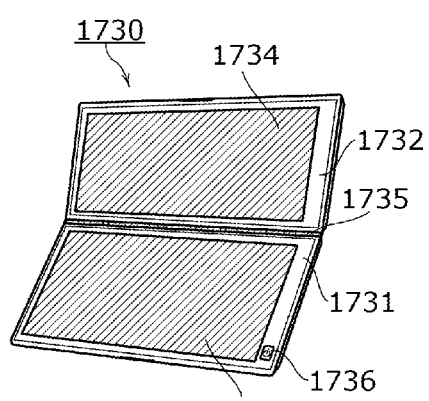

An information terminal 1730 in FIG. 13D includes a housing 1731, a housing 1732, a display portion 1733, a display portion 1734, a joint 1735, an operation button 1736, and the like. The information terminal 1730 can be folded in half.

Figure 13E:
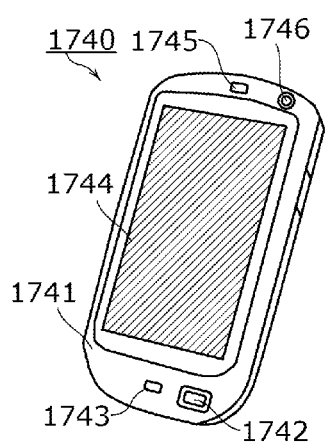

A smartphone 1740 in FIG. 13E includes a housing 1741, an operation button 1742, a microphone 1743, a display portion 1744, a speaker 1745, a camera lens 1746, and the like. An imaging device is incorporated in the housing 1741. Since the camera lens 1746 is provided on the same plane as the display portion 1744, a videophone is possible. For example, a liquid crystal display device with a touch sensor function is used as the display portion 1744.

Figure 13F:
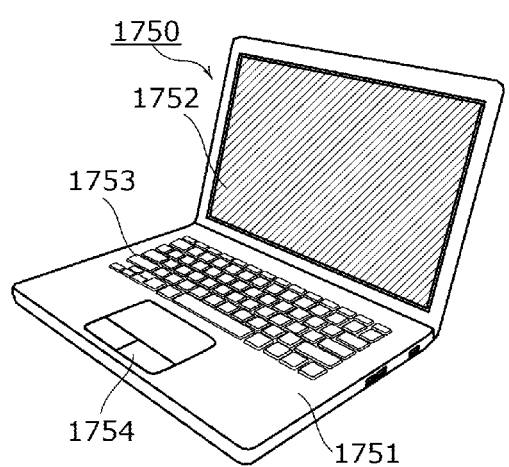

A laptop PC 1750 in FIG. 13F includes a housing 1751, a display portion 1752, a keyboard 1753, a pointing device 1754, and the like.

When a flexible substrate (e.g., a resin film) is used as the substrate of a display panel included in the display device 1521 in the information processing system 1500, the display device 1521 can be bent. Therefore, the information processing system 1500 can be used in a folded state or a bent state. FIGS. 14A to 14G schematically illustrate some information terminals as specific examples of the information processing system 1500.

Figure 14A:
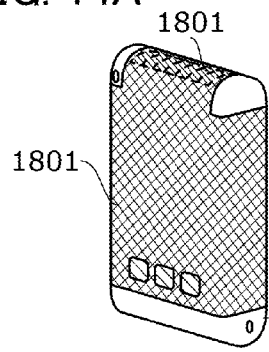
FIGS. 14A to 14G are schematic diagrams each illustrating a structure example of an information terminal.
Figure 14B:
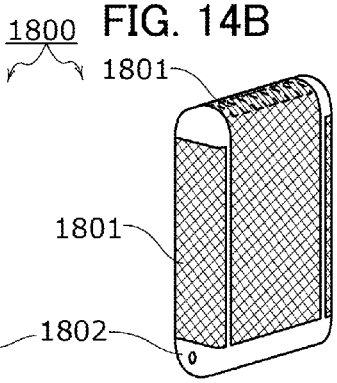
Figure 14C:
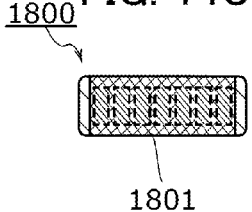

An information terminal 1800 in FIGS. 14A to 14C includes display portions 1801 and a housing 1802 that supports the display portions 1801. The display portion 1801 in a bent state is supported by the housing 1802 so that information can be displayed on a side surface and a top surface of the information terminal 1800. A touch sensor is incorporated in the display portion 1801 and functions as an input/output device. Depending on a region of the display portion 1801 that is touched by a user, operation of the information terminal 1800 can be varied. For example, depending on touch operation of a side surface, a top surface, or a front surface of the information terminal 1800, the information terminal 1800 may execute different processing.

Figure 14D:
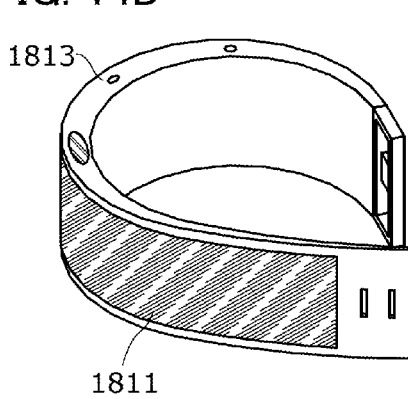
Figure 14E:
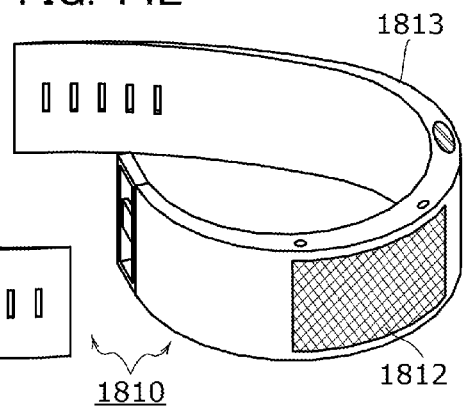

An information terminal 1810 in FIGS. 14D and 14E includes a display portion 1811, a display portion 1812, and a belt-like housing 1813. The housing 1813 supports the display portions 1811 and 1812. Since the housing 1813 is flexible, a user can use the information terminal 1810 while mounting the information terminal 1810 on an arm or the like.

Figure 14F:
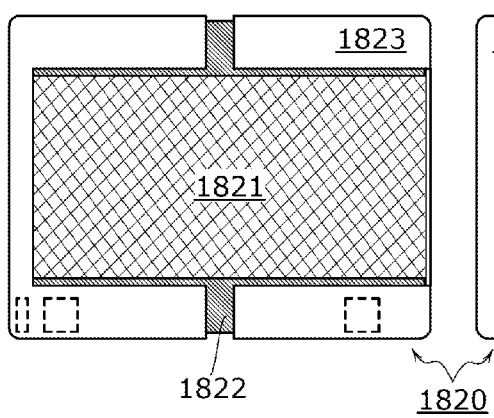
Figure 14G:
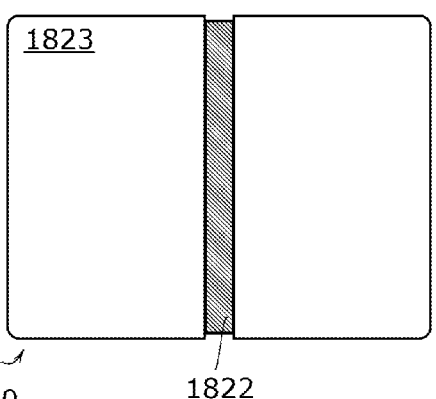

An information terminal 1820 in FIGS. 14F and 14G includes a display portion 1821, a housing 1822, and a housing 1823. The display portion 1801 and the housing 1822 are flexible. Therefore, the information terminal 1820 can be folded in half at the housing 1822.

Embodiment 4

In this embodiment, an OS transistor and a semiconductor device including an OS transistor are described.

<<OS Transistor Structure Example 1>>

Figure 15A:
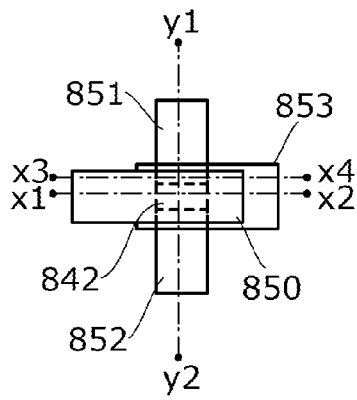
FIG. 15A is a top view illustrating a structure example of a transistor.
Figure 15B:
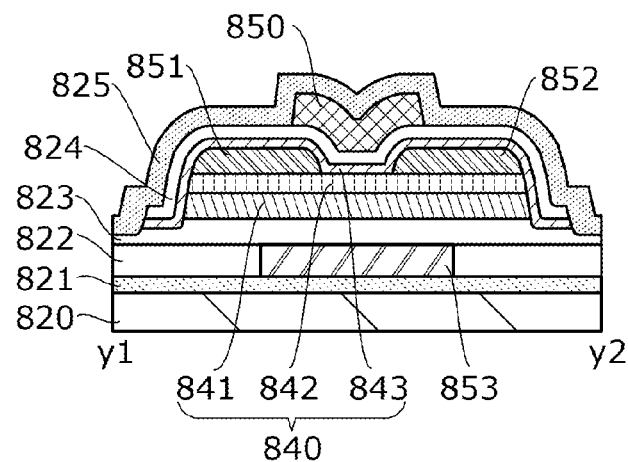
FIG. 15B is a cross-sectional view of the transistor taken along line y1-y2 in FIG. 15A.
Figure 15C:
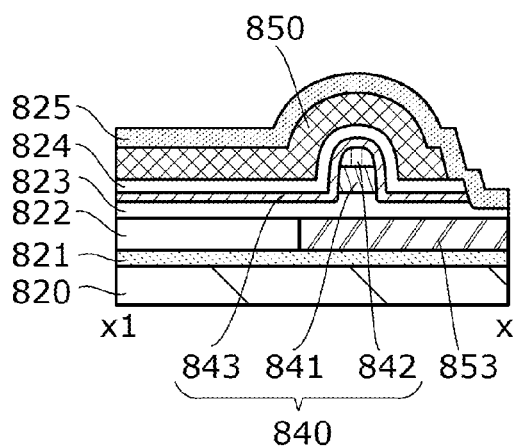
FIG. 15C is a cross-sectional view of the transistor taken along line x1-x2 in FIG. 15A.
Figure 15D:
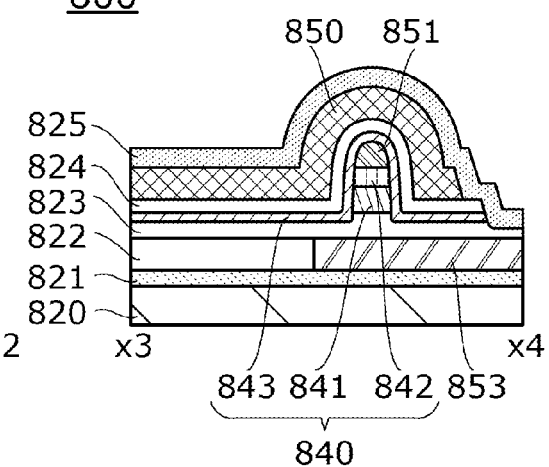
FIG. 15D is a cross-sectional view of the transistor taken along line x3-x4 in FIG. 15A.

FIGS. 15A to 15D illustrate a structure example of an OS transistor. FIG. 15A is a top view illustrating a structure example of an OS transistor. FIG. 15B is a cross-sectional view taken along line y1-y2 in FIG. 15A. FIG. 15C is a cross-sectional view taken along line x1-x2 in FIG. 15A. FIG. 15D is a cross-sectional view taken along line x3-x4 in FIG. 15A. In some cases, the direction of line y1-y2 is referred to as a channel length direction, and the direction of line x1-x2 is referred to as a channel width direction. Note that to clarify the device structure, FIG. 15A does not illustrate some components.

An OS transistor 800 is formed over an insulating surface, here, over an insulating layer 821. The insulating layer 821 is formed over a surface of a substrate 820. The insulating layer 821 functions as a base layer of the OS transistor 800. The OS transistor 800 is covered with an insulating layer 825. Note that the insulating layers 821 and 825 can be regarded as components of the OS transistor 800. The OS transistor 800 includes an insulating layer 822, an insulating layer 823, an insulating layer 824, an insulating layer 825, metal oxide layers 841 to 843, a conductive layer 850, a conductive layer 851, a conductive layer 852, and a conductive layer 853. A channel is mainly formed in the metal oxide layer 842 among the metal oxide layers 841 to 843. Here, the metal oxide layers 841 to 843 are collectively referred to as a semiconductor region 840 for convenience.

The conductive layer 850 functions as a gate electrode, and the conductive layer 853 functions as a back gate electrode. The conductive layers 851 and 852 function as a source electrode and a drain electrode. The insulating layer 821 has a function of electrically isolating the substrate 820 from the conductive layer 853. The insulating layer 824 serves as a gate insulating layer, and the insulating layer 823 serves as gate insulating layers on a back channel side.

The channel length refers to, for example, a distance between a source (a source region or a source electrode) and a drain (a drain region or a drain electrode) in a region where a semiconductor (or a portion where current flows in a semiconductor when a transistor is on) and a gate electrode overlap with each other or in a region where a channel is formed in a top view of the transistor. In one transistor, channel lengths in all regions are not necessarily the same. In other words, the channel length of one transistor is not fixed to one value in some cases. Therefore, in this specification and the like, the channel length is any one of values, the maximum value, the minimum value, or the average value in a region where a channel is formed.

The channel width refers to, for example, the length of a portion where a source and a drain face each other in a region where a semiconductor (or a portion where current flows in a semiconductor when a transistor is on) and a gate electrode overlap with each other or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is sometimes different from a channel width shown in a top view of a transistor (hereinafter referred to as an apparent channel width). For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

In a transistor having a three-dimensional structure, measuring an effective channel width is particularly difficult in some cases. For example, to estimate an effective channel width from a design value, it is necessary to assume that the shape of a semiconductor region is known. Therefore, in the case where the shape of a semiconductor region is not known accurately, measuring an effective channel width accurately is difficult.

Accordingly, in this specification, in a top view of a transistor, an apparent channel width that is the length of a portion where a source and a drain face each other in a region where a semiconductor region and a gate electrode overlap with each other is referred to as a surrounded channel width (SCW) in some cases. Furthermore, in this specification, the term "channel width" may denote a surrounded channel width, an apparent channel width, or an effective channel width. Note that the values of a channel length, a channel width, an effective channel width, an apparent channel width, a surrounded channel width, and the like can be determined by obtaining and analyzing a cross-sectional TEM image and the like.

A surrounded channel width may be used to calculate field-effect mobility, a current value per channel width, and the like of a transistor. In this case, the obtained value is sometimes different from the value obtained by using an effective channel width for the simulation.

As illustrated in FIGS. 15B and 15C, the semiconductor region 840 includes a portion where the metal oxide layer 841, the metal oxide layer 842, and the metal oxide layer 843 are stacked in that order. The insulating layer 824 includes a region covering this stack portion. The conductive layer 850 overlaps with the stack portion with the insulating layer 823 positioned therebetween. The conductive layers 851 and 852 are provided over the stack formed of the metal oxide layers 841 and 843 and are in contact with a top surface of this stack and a side surface positioned in the channel length direction of the stack. The stack of the metal oxide layers 841 and 842 and the conductive layers 851 and 852 are formed by etching using the same mask.

The metal oxide layer 843 is formed to cover the metal oxide layers 841 and 842 and the conductive layers 851 and 852. The insulating layer 824 covers the metal oxide layer 843. Here, the metal oxide layer 843 and the insulating layer 824 are etched using the same mask.

The conductive layer 850 is formed to surround, in the channel width direction, the portion where the metal oxide layers 841 to 843 are stacked with the insulating layer 824 positioned therebetween (see FIG. 15C). Therefore, a gate electric field in a vertical direction and a gate electric field in a lateral direction are applied to this stack portion. In the OS transistor 800, the gate electric field refers to an electric field generated by voltage applied to the conductive layer 850 (gate electrode layer). Accordingly, the whole stack portion of the metal oxide layers 841 to 843 can be electrically surrounded by the gate electric fields, so that a channel is formed in the whole metal oxide layer 842 (bulk) in some cases. Thus, high on-state current of the OS transistor 501 can be achieved.

In this specification and the like, the structure of a transistor in which a semiconductor region is surrounded by the electric field of a gate electrode layer is referred to as a surrounded channel (s-channel) structure. The s-channel structure can improve frequency characteristics of the OS transistor 800. Specifically, the s-channel structure can improve cutoff frequency. The s-channel structure, because of its high on-state current, is suitable for a transistor that operates at high frequency and a semiconductor device such as LSI that needs a scaled down transistor. A semiconductor device including the transistor can operate at high frequency.

Scaling down of the OS transistor can provide a small highly integrated semiconductor device. The OS transistor preferably has, for example, a region where channel length is greater than or equal to 10 nm and less than 1 μm, more preferably greater than or equal to 10 nm and less than 100 nm, still more preferably greater than or equal to 10 nm and less than 70 nm, yet still more preferably greater than or equal to 10 nm and less than 60 nm, even still more preferably greater than or equal to 10 nm and less than 30 nm. In addition, the OS transistor preferably has, for example, a region where channel width is greater than or equal to 10 nm and less than 1 μm, more preferably greater than or equal to 10 nm and less than 100 nm, still more preferably greater than or equal to 10 nm and less than 70 nm, yet still more preferably greater than or equal to 10 nm and less than 60 nm, even still more preferably greater than or equal to 10 nm and less than 30 nm.

<Conductive Layer>

Each of the conductive layers 850 to 853 preferably has a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr); an alloy of such a low-resistance material; or a compound containing such a material as its main component. It is particularly preferable to use a high-melting-point material that has heat resistance and conductivity, such as tungsten or molybdenum. Each of the conductive layers 530 to 533 is preferably formed using a low-resistance conductive material such as aluminum or copper. Each of the conductive layers 530 to 533 is particularly preferably formed using a Cu—Mn alloy because manganese oxide formed at the interface with an insulator containing oxygen has a function of preventing Cu diffusion.

The conductive layers 851 and 852 in an OS transistor 801 are formed using a hard mask used for forming the stack of the metal oxide layers 841 and 842. Therefore, the conductive layers 851 and 852 do not have regions in contact with the side surfaces of the metal oxide layers 841 and 842. For example, through the following steps, the metal oxide layers 841 and 842 and the conductive layers 851 and 852 can be formed. A two-layer oxide semiconductor film including the metal oxide layers 841 and 842 is formed. A single-layer or multi-layer conductive film is formed over the oxide semiconductor film. This conductive film is etched, so that a hard mask is formed. Using this hard mask, the two-layer oxide semiconductor film is etched to form the metal oxide layers 841 and 842. Then, the hard mask is etched to form the conductive layers 851 and 852.

<Metal Oxide Layer>

The metal oxide layer 842 is an oxide semiconductor containing indium (In), for example. The metal oxide layer 842 can have high carrier mobility (electron mobility) by containing indium, for example. The metal oxide layer 842 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the oxide semiconductor, for example. Furthermore, the metal oxide layer 842 preferably contains zinc (Zn). When the oxide semiconductor contains zinc, the oxide semiconductor is easily to be crystallized in some cases.

The metal oxide layer 842 is not limited to the oxide semiconductor containing indium. The metal oxide layer 842 may be an oxide semiconductor which does not contain indium and contains at least one of zinc, gallium, and tin (e.g., a zinc tin oxide or a gallium tin oxide). For the metal oxide layer 842, an oxide with a wide energy gap is used, for example. The energy gap of the metal oxide layer 842 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV. The semiconductor region 840 is preferably formed using a CAAC-OS to be described in Embodiment 5. Alternatively, in the semiconductor region 840, at least the metal oxide layer 842 is preferably formed using a CAAC-OS.

Note that in the case where an oxide semiconductor of the semiconductor region 840 is deposited by sputtering at a substrate temperature of higher than or equal to 150° C. and lower than or equal to 750° C., preferably higher than or equal to 150° C. and lower than or equal to 450° C., more preferably higher than or equal to 200° C. and lower than or equal to 420° C., CAAC-OS can be formed.

The metal oxide layers 841 and 843 include one or more, or two or more elements other than oxygen included in the metal oxide layer 842. Since the metal oxide layers 841 and 843 include one or more, or two or more elements other than oxygen included in the metal oxide layer 842, an interface state is less likely to be formed at an interface between the metal oxide layers 841 and 842 and an interface between the metal oxide layers 842 and 843.

In the case of using an In-M-Zn oxide as the metal oxide layer 841, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the metal oxide layer 841 is formed by sputtering, a sputtering target with the above composition is preferably used. For example, In:M:Zn is preferably 1:3:2.

In the case of using an In-M-Zn oxide as the metal oxide layer 842, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the metal oxide layer 842 is formed by sputtering, a sputtering target with the above composition is preferably used. For example, In:M:Zn is preferably 1:1:1, 1:1:1.2, 2:1:3, 3:1:2, or 4:2:4.1. In particular, when a sputtering target with an atomic ratio of In to Ga and Zn of 4:2:4.1 is used, the atomic ratio of In to Ga and Zn in the metal oxide layer 842 may be 4:2:3 or in the neighborhood of 4:2:3.

In the case of using an In-M-Zn oxide as the metal oxide layer 843, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively.

The metal oxide layer 843 may be an oxide that is the same type as that of the metal oxide layer 841. Note that the metal oxide layer 841 and/or the metal oxide layer 843 does not necessarily contain indium in some cases. For example, at least one of the metal oxide layer 841 and the metal oxide layer 843 may be gallium oxide.

The metal oxide layers 841 and 843 may be oxide semiconductor layers. The metal oxide layers 841 and 843 are preferably oxide semiconductors having lower electric conductivity than the metal oxide layer 842, or may be insulators. When the oxide layers 841 and 843 have lower electric conductivity than the metal oxide layer 842, in the semiconductor region 840, drain current mainly flows to the metal oxide layer 842 and hardly flows to the metal oxide layers 841 and 843. In other words, the metal oxide layer 841 can isolate a channel formation region from the insulating layer 823, and the metal oxide layer 843 can isolate a channel formation region from the insulating layer 824. Therefore, in the semiconductor region 840, a channel is formed in the metal oxide layer 842, and a buried channel can be formed.

<Energy Band Structure>

Figure 16A:
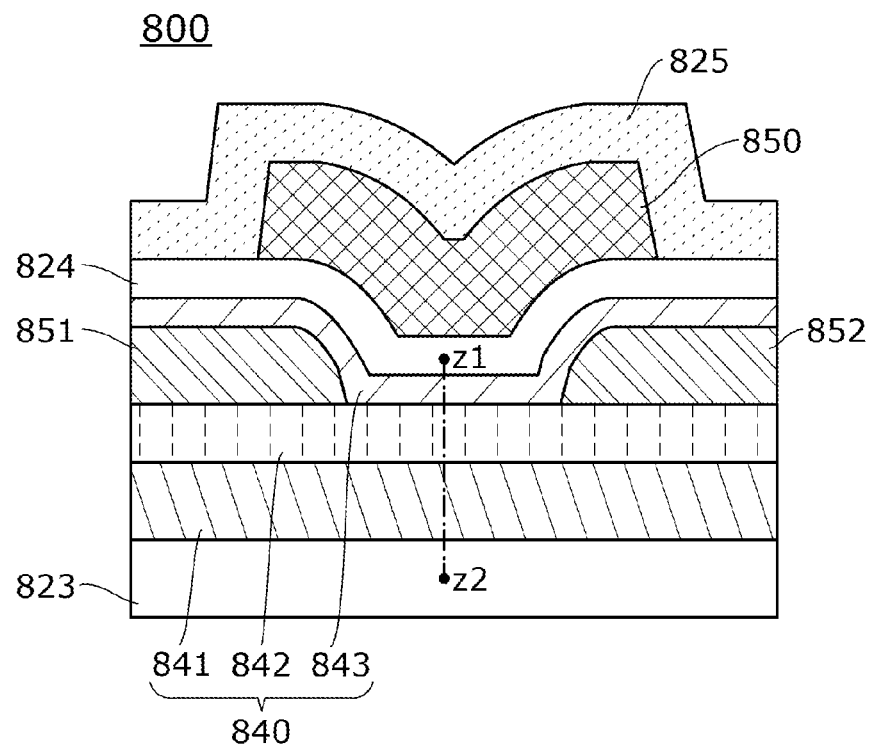
FIG. 16A is a partial enlarged view of FIG. 15B.
Figure 16B:
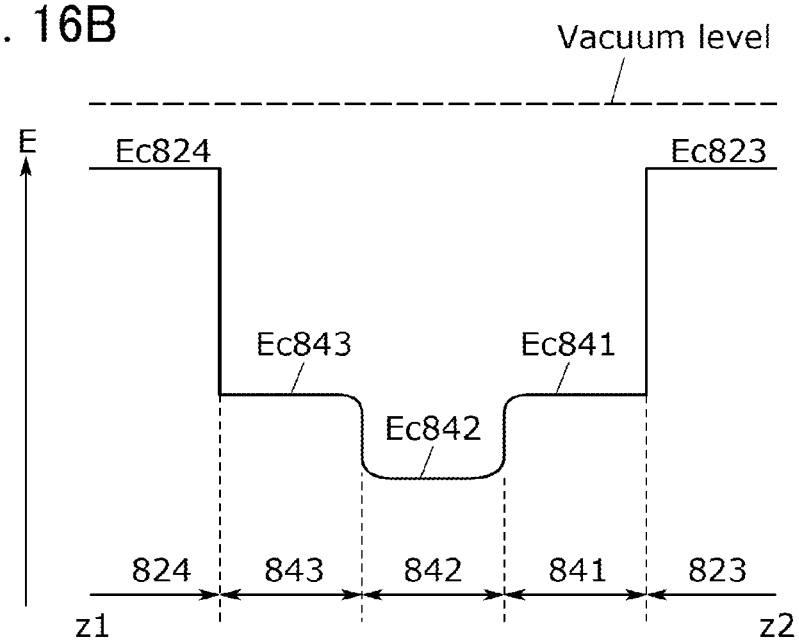
FIG. 16B is an energy band diagram of the transistor.

The function and effect of the semiconductor region 840 in which the metal oxide layers 841, 842, and 843 are stacked are described with reference to FIGS. 16A and 16B. FIG. 16A is a partial enlarged view of an active layer (channel region) of the OS transistor 800 in FIG. 15B. FIG. 16B shows an energy band structure of a portion taken along dotted line z1-z2 (the channel formation region of the OS transistor 800) in FIG. 16A.

In FIG. 16B, Ec823, Ec841, Ec842, Ec843, and Ec824 indicate the energy at the bottom of the conduction band of the insulating layer 823, the metal oxide layer 841, the metal oxide layer 842, the metal oxide layer 843, and the insulating layer 824, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer. The energy difference between the vacuum level and the top of the valence band can be measured using an ultraviolet photoelectron spectroscopy (UPS) device.

Since the insulating layer 823 and the insulating layer 824 are insulators, Ec823 and Ec824 are closer to the vacuum level than Ec841, Ec842, and Ec843 (i.e., the insulating layer 823 and the insulating layer 824 have a lower electron affinity than the semiconductor layers 841, 842, and 843).

The metal oxide layer 842 is an oxide layer having higher electron affinity than those of the metal oxide layers 841 and 843. For example, as the metal oxide layer 842, an oxide having an electron affinity higher than those of the metal oxide layers 841 and 843 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that electron affinity is an energy gap between the vacuum level and the bottom of the conduction band.

An indium gallium oxide has low electron affinity and a high oxygen-blocking property. Therefore, the metal oxide layer 843 preferably includes an indium gallium oxide. The gallium atomic ratio [Ga/(In+Ga)] is, for example, higher than or equal to 70%, preferably higher than or equal to 80%, more preferably higher than or equal to 90%. At this time, when gate voltage is applied, a channel is formed in the metal oxide layer 842 having the highest electron affinity among the metal oxide layers 841 to 843.

In some cases, there is a mixed region of the metal oxide layers 841 and 842 between the metal oxide layers 841 and 842. Furthermore, in some cases, there is a mixed region of the metal oxide layers 842 and 843 between the metal oxide layers 842 and 843. Because the mixed region has low interface state density, a stack of the metal oxide layers 841 to 843 has a band structure where energy at each interface and in the vicinity of the interface is changed continuously (continuous junction).

At this time, electrons move mainly in the metal oxide layer 842, not in the metal oxide layers 841 and 843. As described above, when the interface state density at the interface between the metal oxide layers 841 and 842 and the interface state density at the interface between the metal oxide layers 842 and 843 are decreased, electron movement in the metal oxide layer 842 is less likely to be inhibited and the on-sate current of the OS transistor 800 can be increased.

In the semiconductor region 840 in FIG. 16B, the metal oxide layer 842 forms a well and a channel is formed in the metal oxide layer 842. Note that the energy of the bottom of the conduction band in the semiconductor region 840 continuously changes; therefore, the well can also be referred to as an U-shape well, and a channel with such an energy band structure can also be referred to as a buried channel.

As factors of inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in a channel formation region is large. The electron movement is also inhibited, for example, in the case where the density of defect states is high in the channel formation region.

To increase the on-state current of the OS transistor 800, for example, root mean square (RMS) roughness with a measurement area of 1 μm×1 μm of a top surface or a bottom surface of the metal oxide layer 842 (a formation surface; here, the top surface of the metal oxide layer 842) is less than 1 nm, preferably less than 0.6 nm, more preferably less than 0.5 nm, still more preferably less than 0.4 nm. The average surface roughness (Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, more preferably less than 8 nm, still more preferably less than 7 nm. RMS roughness, Ra, and P–V can be measured using a scanning probe microscope.

For example, in the case where the metal oxide layer 842 contains oxygen vacancies ($V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the OS transistor 800 because $V_OH$ scatters electrons. Note that sites of oxygen vacancies become more stable by entry of oxygen than by entry of hydrogen. Thus, by decreasing oxygen vacancies in the metal oxide layer 842, the on-state current of the OS transistor 800 can be increased in some cases.

For example, at a certain depth in the metal oxide layer 842 or in a certain region of the metal oxide layer 842, the concentration of hydrogen measured by secondary ion mass spectrometry (SIMS) is set to be higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$.

To decrease oxygen vacancies in the metal oxide layer 842, for example, there is a method in which excess oxygen contained in the insulating layer 823 is moved to the metal oxide layer 842 through the metal oxide layer 841. In that case, the metal oxide layer 841 is preferably a layer having an oxygen-transmitting property (a layer through which oxygen is transmitted). For example, heat treatment is performed at a temperature higher than or equal to 150° C. and lower than 600° C. after formation of the insulating layer 825, so that oxygen contained in an insulating layer (e.g., the insulating layer 823) in contact with the semiconductor region 840 is diffused to be moved to the metal oxide layer 842. This allows oxygen vacancies in the metal oxide layer 842 to be filled with oxygen. The density of localized levels of the metal oxide layer 842 is reduced; therefore, the OS transistor 800 with excellent electrical characteristics can be formed. Furthermore, the OS transistor 800 with high reliability and few variations with time in electrical characteristics or few variations in electrical characteristics due to a stress test can be formed. The temperature of the heat treatment at this time can be higher than or equal to 250° C. and lower than or equal to 500° C., preferably higher than or equal to 300° C. and lower than or equal to 450° C.

In the case where the OS transistor 800 has an s-channel structure, a channel is formed in the entire metal oxide layer 842. Therefore, as the metal oxide layer 842 has larger thickness, a channel region becomes larger. In other words, the thicker the metal oxide layer 842 is, the larger the on-state current of the OS transistor 800 is.

Moreover, the thickness of the metal oxide layer 843 is preferably as small as possible to increase the on-state current of the OS transistor 800. For example, the metal oxide layer 843 has a region with a thickness of less than 10 nm, preferably less than or equal to 5 nm, more preferably less than or equal to 3 nm. Meanwhile, the metal oxide layer 843 has a function of blocking entry of elements other than oxygen (such as hydrogen and silicon) included in the adjacent insulator into the metal oxide layer 842 where a channel is formed. Thus, the metal oxide layer 843 preferably has a certain thickness. For example, the metal oxide layer 843 may have a region with a thickness of greater than or equal to 0.3 nm, preferably greater than or equal to 1 nm, more preferably greater than or equal to 2 nm. The metal oxide layer 843 preferably has an oxygen blocking property to inhibit outward diffusion of oxygen released from the insulating layers 823 and 824 and the like.

To improve reliability of the OS transistor 800, preferably, the thickness of the metal oxide layer 841 is large and the thickness of the metal oxide layer 843 is small. For example, the metal oxide layer 841 has a region with a thickness of greater than or equal to 10 nm, preferably greater than or equal to 20 nm, more preferably greater than or equal to 40 nm, still more preferably greater than or equal to 60 nm. When the thickness of the metal oxide layer 841 is made large, a distance from an interface between the adjacent insulator and the metal oxide layer 841 to the metal oxide layer 842 in which a channel is formed can be large. Note that the metal oxide layer 841 has a region with a thickness of, for example, less than or equal to 200 nm, preferably less than or equal to 120 nm, more preferably less than or equal to 80 nm because the productivity of the semiconductor device might be decreased.

In order that the OS transistor 800 have stable electrical characteristics, it is effective to make the metal oxide layer 842 intrinsic or substantially intrinsic by reducing the concentration of impurities in the semiconductor region 840. Note that in this specification and the like, the carrier density of a substantially intrinsic oxide semiconductor is lower than $8\times10^{11}$/cm$^3$, preferably lower than $1\times10^{11}$/cm$^3$, more preferably lower than $1\times10^{10}$/cm$^3$. Alternatively, the carrier density of a substantially intrinsic or intrinsic oxide semiconductor can be higher than or equal to $1\times10^{-9}$/cm$^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity levels serve as traps and might cause the electric characteristics of the transistor to deteriorate. Therefore, it is preferable to reduce the concentration of the impurities in the metal oxide layers 841, 842, and 843 and at interfaces between the metal oxide layers.

For example, a region in which the concentration of silicon is higher than or equal to $1\times10^{16}$ atoms/cm$^3$ and lower than $1\times10^{19}$ atoms/cm$^3$ is provided between the metal oxide layers 841 and 842. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. A region in which the concentration of silicon is higher than or equal to $1\times10^{16}$ atoms/cm$^3$ and lower than $1\times10^{19}$ atoms/cm$^3$ is provided between the metal oxide layers 842 and 843. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. The concentration of silicon can be measured by SIMS.

It is preferable to reduce the concentration of hydrogen in the metal oxide layers 841 and 843 in order to reduce the concentration of hydrogen in the metal oxide layer 842. The metal oxide layers 841 and 843 each have a region in which the concentration of hydrogen is higher than or equal to $1\times10^{16}$ atoms/cm$^3$ and lower than or equal to $2\times10^{20}$ atoms/cm$^3$. The concentration of hydrogen is preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$. The concentration of hydrogen can be measured by SIMS.

It is preferable to reduce the concentration of nitrogen in the metal oxide layers 841 and 843 in order to reduce the concentration of nitrogen in the metal oxide layer 842. The metal oxide layers 841 and 843 each have a region in which the concentration of nitrogen is higher than or equal to $1\times10^{16}$ atoms/cm$^3$ and lower than $5\times10^{19}$ atoms/cm$^3$. The concentration of nitrogen is preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $1\times10^{18}$ atoms/cm$^3$, still more preferably higher than or equal to $1\times10^{16}$ atoms/cm$^3$ and lower than or equal to $5\times10^{17}$ atoms/cm$^3$. The concentration of nitrogen can be measured by SIMS.

A transistor in which the above highly purified oxide semiconductor is used for a channel formation region exhibits extremely low off-state current. When voltage between a source and a drain is set at about 0.1 V, 5 V, or 10 V, for example, the off-state current standardized on the channel width of the transistor can be as low as several yoctoamperes per micrometer to several zeptoamperes per micrometer.

FIGS. 15A to 15D illustrate examples in which the semiconductor region 840 has a three-layer structure; however, one embodiment of the present invention is not limited thereto. For example, the semiconductor region 840 may have a two-layer structure without the metal oxide layer 841 or 843. Alternatively, the semiconductor region 840 can have a four-layer structure in which a metal oxide layer similar to the metal oxide layers 841 to 843 is provided over or below the metal oxide layer 841 or over or below the metal oxide layer 843. Alternatively, the semiconductor region 840 can have an n-layer structure (n is an integer of 5 or more) in which metal oxide layers similar to the metal oxide layers 841 to 843 are provided at two or more of the following positions: over the metal oxide layer 841, below the metal oxide layer 841, over the metal oxide layer 843, and below the metal oxide layer 843.

In the case where the OS transistor 800 has no back gate electrode, neither the conductive layer 853 nor the insulating layer 822 is provided, and the insulating layer 823 is formed over the insulating layer 821.

<Insulating Layer>

The insulating layers 821 to 825 are each formed using an insulating film having a single-layer structure or a layered structure. Examples of the material of an insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

In this specification, an oxynitride refers to a substance that includes more oxygen than nitrogen, and a nitride oxide refers to a substance that includes more nitrogen than oxygen. In this specification and the like, an oxide whose nitrogen concentration is lower than 1 atomic % is also used as an insulating material.

The insulating layers 823 and 824 each preferably contain an oxide because they are in contact with the semiconductor region 840. In particular, the insulating layers 823 and 824 each preferably contain an oxide material from which part of oxygen is released by heating. The insulating layers 823 and 824 each preferably contain an oxide containing oxygen more than that in the stoichiometric composition. Part of oxygen is released by heating from an oxide film containing oxygen more than that in the stoichiometric composition. Oxygen released from the insulating layers 823 and 824 is supplied to the semiconductor region 840 that is an oxide semiconductor, so that oxygen vacancies in the oxide semiconductor can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulating layers 821 and 825 each preferably have a passivation function for preventing oxygen contained in the insulating layers 823 and 824 from being decreased. Alternatively, the insulating layers 821 and 825 each preferably have a function of blocking oxygen, hydrogen, water, an alkali metal, an alkaline earth metal, and the like. The insulating layers 821 and 825 with such a function can prevent outward diffusion of oxygen from the semiconductor region 840 and entry of hydrogen, water, or the like into the semiconductor region 840 from the outside. The insulating layers 821 and 825 may each be formed using, for example, at least one insulating layer of silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, hafnium oxynitride, or the like so that they can have such a function.

<Charge Trap Layer>

While the threshold voltage of a Si transistor can be easily controlled by channel doping, the threshold voltage of an OS transistor is difficult to change effectively by channel doping. In an OS transistor, the threshold voltage can be changed by injecting electrons into a charge trap layer. For example, electrons may be injected into the charge trap layer with the use of the tunnel effect. By applying positive voltage to the conductive layer 853, tunnel electrons are injected into the charge trap layer.

In the OS transistor 800, a charge trap layer can be provided over the insulating layer 823. An example of the charge trap layer is an insulating layer formed using hafnium oxide, aluminum oxide, tantalum oxide, aluminum silicate, or the like. The insulating layer 823 can have a three-layer structure of a silicon oxide layer, a hafnium oxide layer, and a silicon oxide layer, for example.

<Substrate>

As the substrate 820, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate can be used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. The semiconductor substrate may be a bulk semiconductor substrate or may be a silicon on insulator (SOI) substrate in which a semiconductor layer is provided for a semiconductor substrate with an insulating region positioned therebetween. As the conductor substrate, a graphite substrate, a metal substrate, an alloy substrate, a conductive resin substrate, or the like can be used. A substrate including a metal nitride, a substrate including a metal oxide, or the like can be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. As the element provided over the substrate, a capacitor, a resistor, a switching element, a light-emitting element, a memory element, or the like can be used.

A flexible substrate may be used as the substrate 820. As a method for providing a transistor over a flexible substrate, there is a method in which a transistor is formed over a non-flexible substrate (e.g., a semiconductor substrate), and then the transistor is separated and transferred to the substrate 820 that is a flexible substrate. In that case, a separation layer is preferably provided between the non-flexible substrate and the transistor. As the substrate 820, a sheet, a film, or foil containing a fiber may be used. The substrate 820 may have elasticity. The substrate 820 may have a property of returning to its original shape when bending or pulling is stopped. Alternatively, the substrate 820 may have a property of not returning to its original shape. The thickness of the substrate 820 is, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 820 has small thickness, the weight of the semiconductor device can be reduced. When the substrate 820 has small thickness, even in the case of using glass or the like, the substrate 820 may have elasticity or a property of returning to its original shape when bending or pulling is stopped. Therefore, an impact applied to the semiconductor device over the substrate 820, which is caused by dropping or the like, can be reduced. That is, a durable semiconductor device can be provided.

For the flexible substrate 820, metal, an alloy, resin, glass, or fiber thereof can be used, for example. The flexible substrate preferably has a lower coefficient of linear expansion because deformation due to an environment is suppressed. The flexible substrate is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate because of its low coefficient of linear expansion.

<<OS Transistor Structure Example 2>>

Figure 17A:
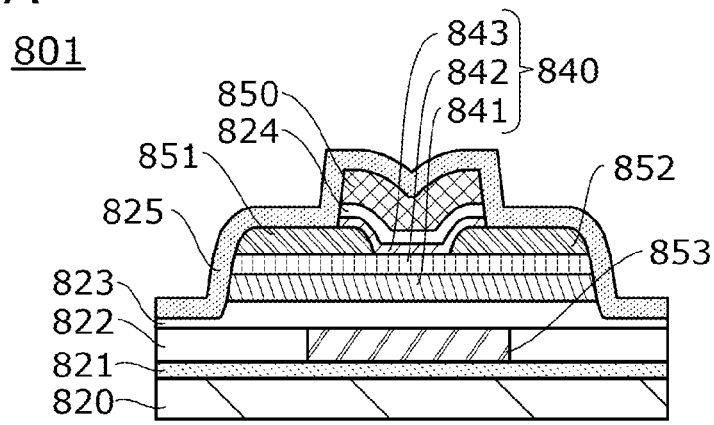
FIGS. 17A to 17C are cross-sectional view each illustrating a structure example of a transistor.

The metal oxide layer 843 and the insulating layer 824 may be etched using the conductive layer 850 as a mask. FIG. 17A illustrates a structure example of an OS transistor manufactured through such steps. In the OS transistor 801 in FIG. 17A, end portions of the metal oxide layer 843 and the insulating layer 824 are substantially aligned with an end portion of the conductive layer 850. The metal oxide layer 843 and the insulating layer 824 are provided only below the conductive layer 850.

<<OS Transistor Structure Example 3>>

Figure 17B:
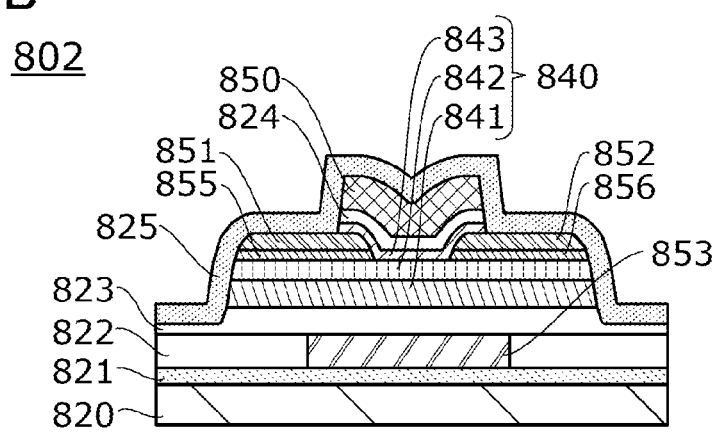

An OS transistor 802 in FIG. 17B has a device structure in which conductive layers 855 and 856 are added to the OS transistor 801. A pair of electrodes functioning as a source electrode and a drain electrode is formed using a stack of the conductive layers 851 and 855 and a stack of the conductive layers 852 and 856.

The conductive layers 855 and 856 are formed using a single-layer or multilayer conductor. The conductive layers 855 and 856 may have a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy film or a compound may be used, for example, and a conductor containing aluminum, a conductor containing copper and titanium, a conductor containing copper and manganese, a conductor containing indium, tin, and oxygen, a conductor containing titanium and nitrogen, or the like may be used as the conductor.

The conductive layers 855 and 856 may have a property of transmitting visible light. Alternatively, the conductive layers 855 and 856 may have a property of not transmitting visible light, ultraviolet light, infrared light, or an X-ray by reflecting or absorbing it. In some cases, such a property can suppress a change in electrical characteristics of the OS transistor 802 due to stray light.

The conductive layers 855 and 856 may preferably be formed using a layer that does not form a Schottky barrier with the metal oxide layer 842 or the like. Accordingly, on-state characteristics of the OS transistor 802 can be improved.

The conductive layers 855 and 856 preferably have higher resistance than the conductive layers 851 and 852 according to circumstances. The conductive layers 855 and 856 preferably have lower resistance than the channel (the metal oxide layer 842) of the OS transistor 802 according to circumstances. For example, the conductive layers 855 and 856 may have a resistivity of higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The conductive layers 855 and 856 having resistivity within the above range can reduce electric field concentration in a boundary portion between the channel and the drain. Therefore, a change in electrical characteristics of the OS transistor 802 can be suppressed. In addition, punch-through current generated by an electric field from the drain can be reduced. Thus, a transistor with small channel length can have favorable saturation characteristics. Note that in a circuit configuration where the source and the drain do not interchange, only one of the conductive layers 855 and 856 (e.g., the layer on the drain side) is preferably provided according to circumstances.

<<OS Transistor Structure Example 4>>

Figure 17C:
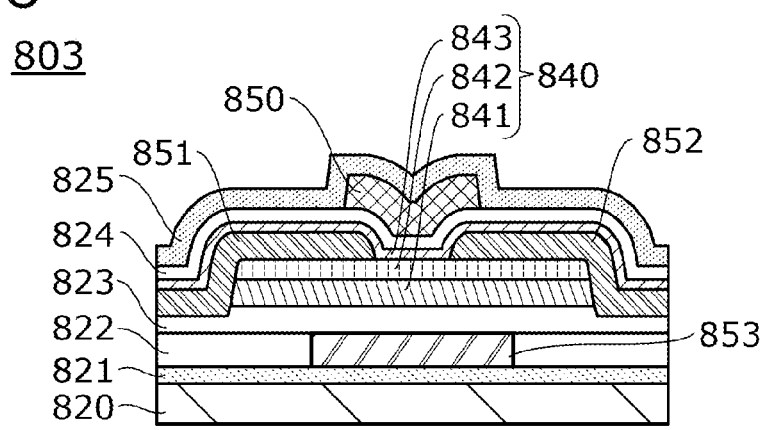

In the OS transistor 800 in FIGS. 15A to 15D, the conductive layers 851 and 852 may be in contact with side surfaces of the metal oxide layers 841 and 842. Such a structure example is illustrated in FIG. 17C. In an OS transistor 803 in FIG. 17C, the conductive layers 851 and 852 may be in contact with side surfaces of the metal oxide layers 841 and 842.

<<OS Transistor Structure Example 5>>

FIGS. 18A to 18C illustrate a structure example of an OS transistor. FIG. 18A is a top view illustrating a structure example of an OS transistor 804. FIG. 18B is a cross-sectional view taken along line y5-y6 in FIG. 18A. FIG. 18C is a cross-sectional view taken along line x5-x6 in FIG. 18A. Note that to clarify the top view, FIG. 18A does not illustrate some components.

The OS transistor 804 is a modification example of the OS transistor 803 (FIG. 17C) and has an s-channel structure. The conductive layer 853 is covered with an insulating layer 826, and the metal oxide layers 841 and 842 and the conductive layers 851 and 852 are covered with an insulating layer 827. The insulating layers 826 and 827 can be formed in a manner similar to that of the insulating layers 821 to 825.

The metal oxide layer 843, the insulating layer 824, and the conductive layer 850 are provided over the insulating layer 827. In the OS transistor 804, a region functioning as a gate electrode in the conductive layer 850 is formed in a self-aligning manner to bury an opening of the insulating layer 827 or the like. Therefore, parasitic capacitance due to overlap of the conductive layers 850 and 851 and parasitic capacitance due to overlap of the conductive layers 850 and 852 in the OS transistor 804 can be smaller than those in the OS transistor 803.

In the process of manufacturing the semiconductor device, insulators, conductors, and semiconductors may be formed by sputtering, chemical vapor deposition (CVD) (including thermal CVD, metal organic CVD (MOCVD), plasma-enhanced CVD (PECVD), and the like), molecular beam epitaxy (MBE), atomic layer deposition (ALD), pulsed laser deposition (PLD), or the like. For example, it is preferable that insulating films be formed by CVD, more preferably PECVD because coverage can be improved. In the case where an insulating film is formed by CVD, it is preferable to use thermal CVD, MOCVD, or ALD in order to reduce plasma damage. In the case where an insulating film is formed by sputtering, a facing-target sputtering device, a parallel plate sputtering device, or the like may be used. For example, the metal oxide layer 842 of the semiconductor region 840 is preferably formed with a facing-target sputtering device.

<<Device Structure Example of Memory Cell>>

An OS transistor can be stacked over an element layer in which a Si transistor and the like are formed. The memory 104 in Embodiment 1 can have a device structure in which a Si transistor and an OS transistor are stacked. Here, the device structure of a memory including an OS transistor is described with reference to FIG. 19, FIG. 20, FIG. 21, and FIG. 22.

Figure 19:
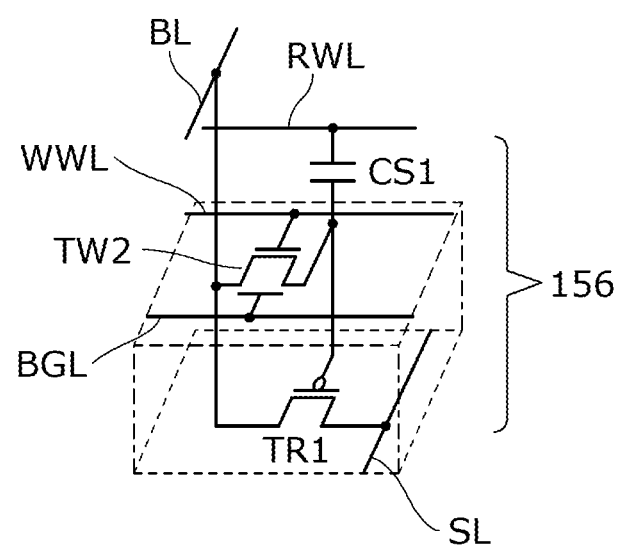
FIG. 19 is a circuit diagram schematically illustrating a device structure of a memory cell.

FIG. 19 is a circuit diagram schematically illustrating the device structure of a memory cell. A memory cell 156 in FIG. 19 is a modification example of the memory cell 154, which includes the transistor TW2 instead of the transistor TW1.

Figure 20:
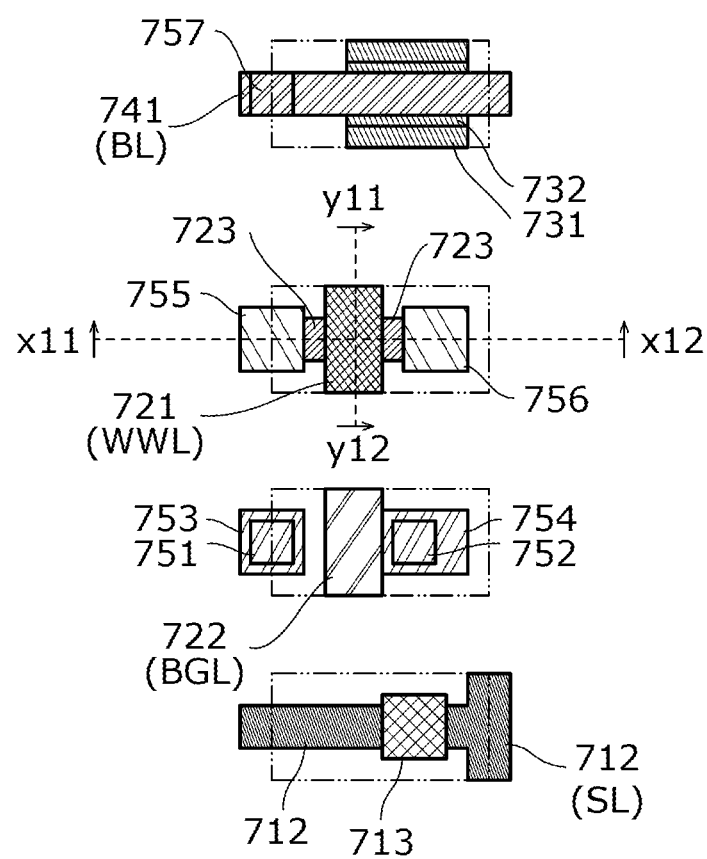
FIG. 20 is an exploded plan view illustrating a layout example of the memory cell.
Figure 21:
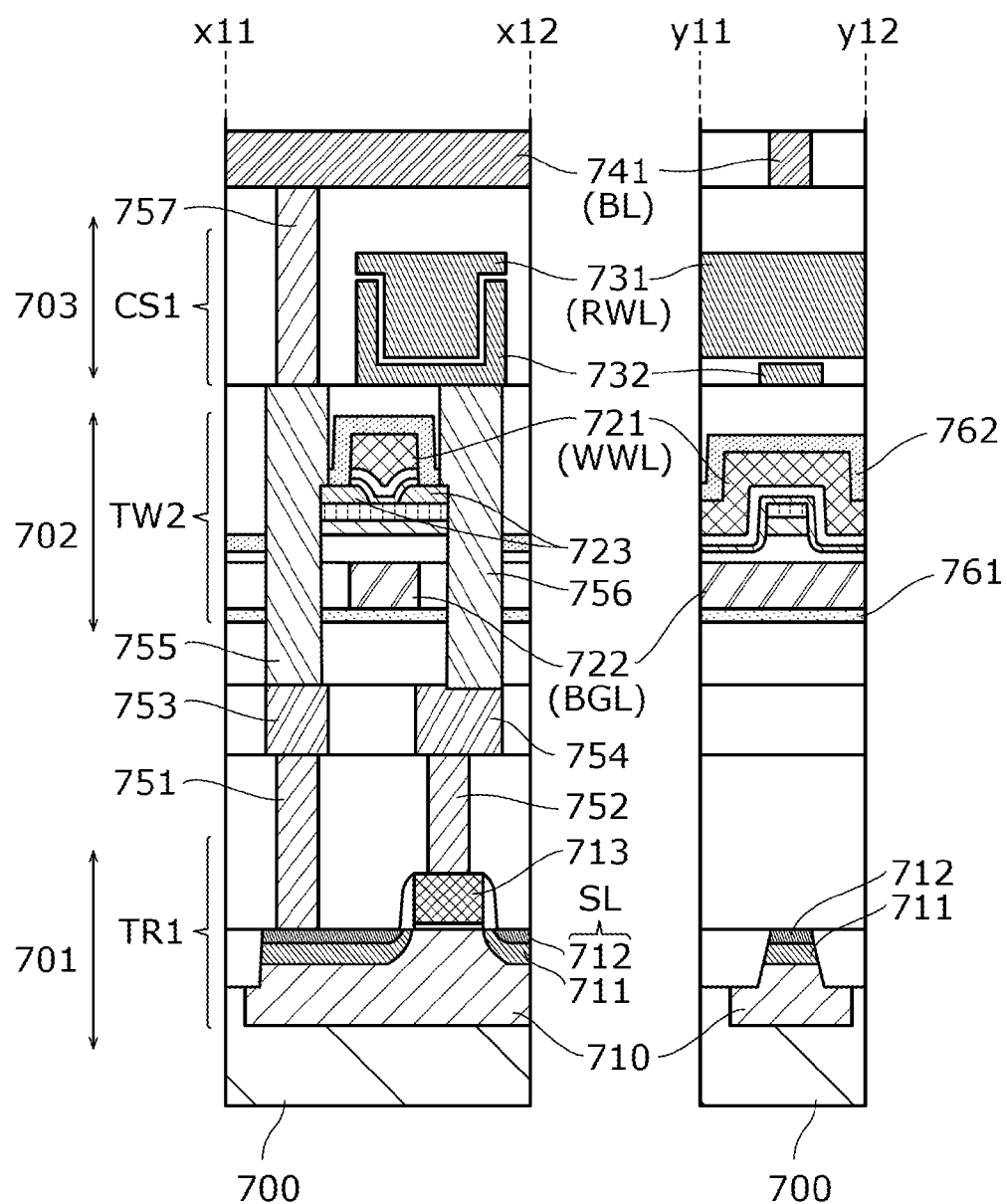
FIG. 21 illustrates cross-sectional views taken along line x11-x12 and line y11-y12 in FIG. 20.

FIG. 20 is an exploded plan view illustrating a layout example of the memory cell 156. In FIG. 20, some components are not illustrated. FIG. 21 illustrates cross-sectional views taken along line x11-x12 and line y11-y12 in FIG. 20. The cross-sectional view taken along line x11-x12 illustrates the transistor TW2 in the channel length direction, and the cross-sectional view taken along line y11-y12 illustrates the transistor TW2 in the channel width direction. In FIG. 21, regions that are not denoted by reference numerals or are not hatched are regions formed using insulators. Reference numerals 761 and 762 each denote an insulating layer.

The memory cell 156 is formed on a single crystal silicon wafer 700. Element layers 701 to 703 are formed over the single crystal silicon wafer 700. The element layers 701, 702, and 703 are layers in which a Si transistor, an OS transistor, and a capacitor are formed, respectively.

A p-type well 710 is formed on the single crystal silicon wafer 700. The transistor TR1 is formed on the p-type well 710. The transistor TR1 includes p-type impurity regions 711 and 712 and a conductor 713. The conductor 713 forms the gate electrode of the transistor TR1. The wiring SL is formed of the p-type impurity regions 711 and 712.

The device structure of the transistor TW2 is similar to that of the OS transistor 800 (FIGS. 15A to 15D). A conductor 721 forms a gate electrode of the transistor TW2 and the wiring WL. A conductor 722 forms the back gate electrode of the transistor TW2 and a wiring OBG. A pair of conductors 723 forms a source electrode and a drain electrode of the transistor TW2. The capacitor CS1 includes a conductor 731 and a conductor 732. The conductor 731 forms the wiring RWL. A conductor 741 forms the wiring BL.

The transistors TR2 and TW2, the capacitor CS1, and the wirings WWL, RWL, BL, and SL are electrically connected through conductors 751 to 757; thus, the memory cell 156 is formed.

Figure 22:
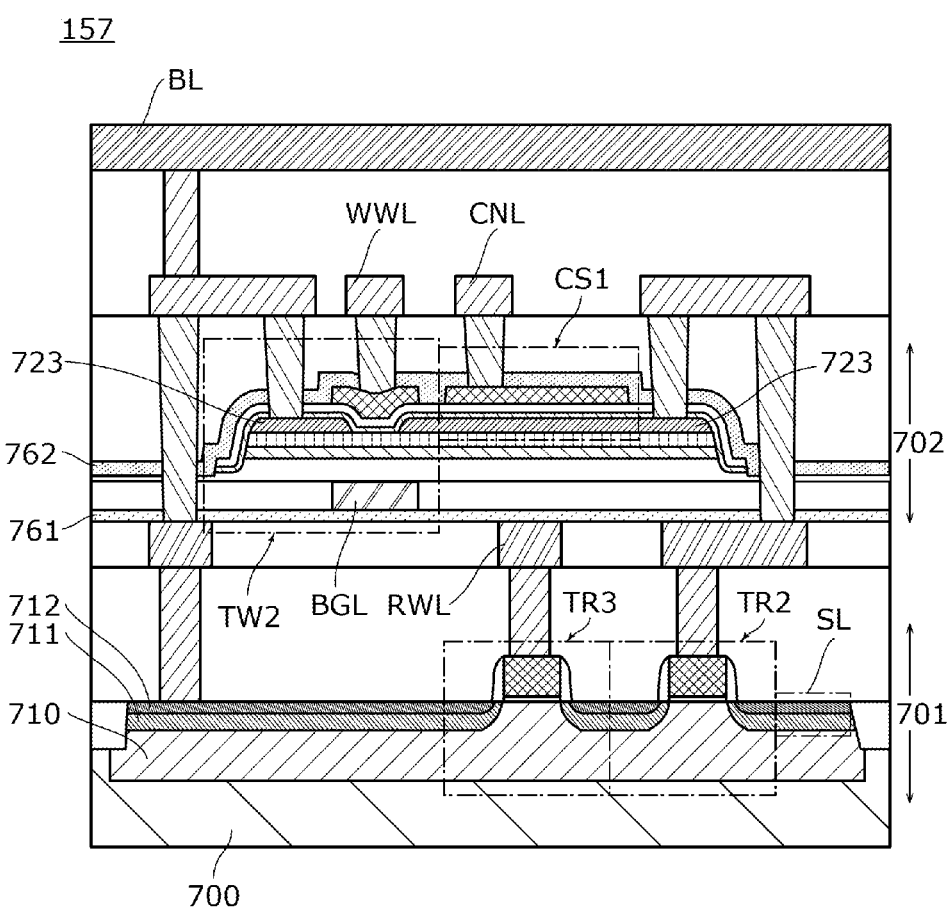
FIG. 22 is a cross-sectional view illustrating a device structure example of a memory cell array.

The OS transistor and the storage capacitor can be formed in the same element layer. FIG. 22 illustrates an example of such a case. A memory cell 157 in FIG. 22 is a modification example of the memory cell 155 (FIG. 3F), which includes the transistor TW2 instead of the transistor TW1. In FIG. 22, regions that are not denoted by reference numerals or are not hatched are regions formed using insulators. In FIG. 21, regions that are not denoted by reference numerals or are not hatched are regions formed using insulators. Furthermore, regions that are hatched but not denoted by reference numerals are formed using conductors and form wirings and electrodes. By these conductors, the memory cell 157 is electrically connected to the wirings WWL, RWL, BL, SL, CNL, and OBG.

The transistor TW2 has a device structure similar to that of the OS transistor 800 (FIGS. 15A to 15D). The capacitor CS1 is formed in the same process as the transistor MW2, leading to a reduction in the number of manufacturing steps of a memory chip. One of the pair of electrodes of the capacitor CS1 is formed of the conductor 723, and the other is formed of a conductor formed using the same layer as the gate electrode of the transistor TW2.

Figure 23A:
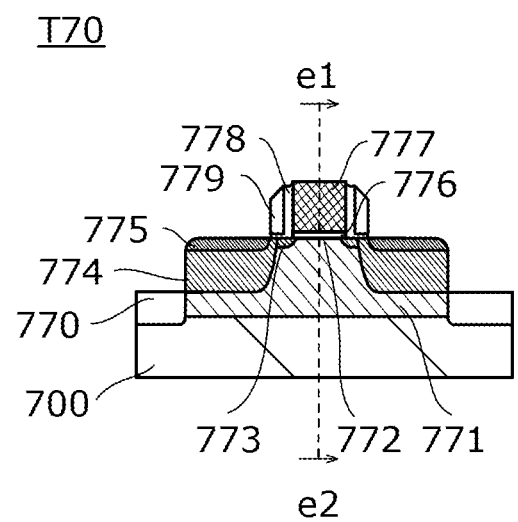
FIGS. 23A and 23B are cross-sectional views each illustrating a structure example of a transistor.
Figure 23B:
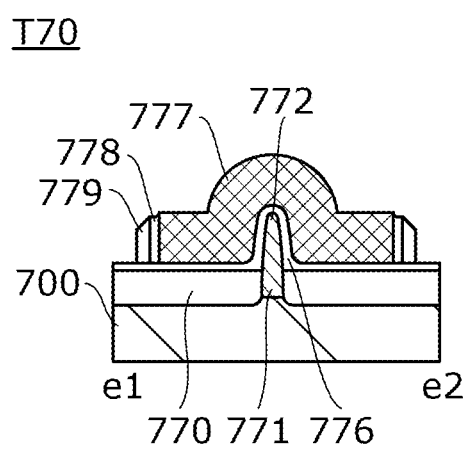

Here, the transistors TR1 to TR3 are planar transistor; however, one embodiment of the present invention is not limited thereto. The transistors TR1 to TR3 may be, for example, transistors with 3D structures (e.g., FIN transistors or tri-gate transistors). FIGS. 23A and 23B illustrate an example of a FIN transistor. FIG. 23A is a cross-sectional view of the transistor in a channel length direction, and FIG. 23B is a cross-sectional view taken along line e1-e2 in FIG. 23A.

A transistor T70 in FIGS. 23A and 23B includes an active layer (semiconductor region) 772 with a convex shape, and a gate insulating layer 776 and a gate electrode 777 are provided along a side surface and an upper surface of the active layer 772. Reference numeral 770 denotes an element isolation layer. Reference numerals 771, 773, and 774 denote a well, a lightly doped region, and a heavily doped region, respectively. Reference numeral 775 denotes a conductive region. Reference numerals 778 and 779 denote sidewall insulating layers. Although FIGS. 23A and 23B illustrate the case where the single crystal silicon wafer 700 is processed to have a convex shape, an SOI substrate may be processed into a semiconductor region with a convex shape.

In the case where the memory cells 151 to 153 (FIGS. 3A to 3C) form the memory cell array 120, the transistors in the memory cell array 120 can be OS transistors. Therefore, the Si transistors formed on the single crystal silicon wafer 700 form the row driver 121 and the column driver 122, and the memory cell array 120 can be stacked on these drivers 121 and 122.

Embodiment 5

In this embodiment, an oxide semiconductor is described. An oxide semiconductor described here is a metal oxide that can be applied to the metal oxide layers 841 to 843 of the OS transistor in Embodiment 4.

In this specification and the like, trigonal and rhombohedral crystal systems are included in a hexagonal crystal system. In this specification and the like, the term "parallel" indicates that an angle formed between two straight lines is greater than or equal to −10° and less than or equal to 10°, and accordingly includes the case where the angle is greater than or equal to −5° and less than or equal to 5°. The term "substantially parallel" indicates that an angle formed between two straight lines is greater than or equal to −30° and less than or equal to 30°. In addition, the term "perpendicular" indicates that an angle formed between two straight lines is greater than or equal to 80° and less than or equal to 100°, and accordingly includes the case where the angle is greater than or equal to 85° and less than or equal to 95°. The term "substantially perpendicular" indicates that an angle formed between two straight lines is greater than or equal to 60° and less than or equal to 120°.

<<Oxide Semiconductor Structure>>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order. This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and thus has an unstable structure. For this reason, an a-like OS has physical properties similar to those of an amorphous oxide semiconductor.

<CAAC-OS>

A CAAC-OS is an oxide semiconductor having a plurality of c-axis aligned crystal parts (also referred to as pellets).

When a combined analysis image (also referred to as a high-resolution TEM image) of a bright-field image and a diffraction pattern of a CAAC-OS is observed by a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

The CAAC-OS observed with a TEM is described below. A high-resolution TEM image of a cross section of the CAAC-OS observed from a direction substantially parallel to a sample surface shows that metal atoms are arranged in a layered manner in a pellet. Each metal atom layer has a configuration reflecting unevenness of a surface over which a CAAC-OS film is formed (hereinafter the surface is referred to as a formation surface) or a top surface of the CAAC-OS, and is arranged parallel to the formation surface or the top surface of the CAAC-OS.

According to the high-resolution TEM image, the CAAC-OS has a characteristic atomic arrangement. The size of a pellet is greater than or equal to 1 nm or greater than or equal to 3 nm, and the size of a space caused by tilt of the pellets is approximately 0.8 nm. Therefore, the pellet can also be referred to as a nanocrystal (nc). The CAAC-OS can be referred to as an oxide semiconductor including c-axis aligned nanocrystals (CANC).

A Cs-corrected high-resolution TEM image of a plane of the CAAC-OS observed from a direction substantially perpendicular to the sample surface shows that metal atoms are arranged in a triangular, quadrangular, or hexagonal configuration in a pellet. However, there is no regularity of arrangement of metal atoms between different pellets.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31°. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

In structural analysis of the CAAC-OS by an out-of-plane method, another peak might appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), a peak is not clearly observed. In contrast, in the case of a single crystal oxide semiconductor of InGaZnO$_4$, when φ scan is performed with 2θ fixed at around 56°, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in the direction parallel to the sample surface, a diffraction pattern (also referred to as a selected-area transmission electron diffraction pattern) can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, a ring-like diffraction pattern is observed when an electron beam with a probe diameter of 300 nm is incident on the same sample in a direction perpendicular to the sample surface. Therefore, the electron diffraction also indicates that the a-axes and b-axes of the pellets included in the CAAC-OS do not have regular alignment.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (e.g., silicon) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, more preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. That is, the CAAC-OS can be referred to as an oxide semiconductor having stable characteristics.

<Nc-OS>

An nc-OS has a region in which a crystal part is observed and a region in which a crystal part is not observed clearly in a high-resolution TEM image. In most cases, a crystal part in the nc-OS is greater than or equal to 1 nm and less than or equal to 100 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, a grain boundary cannot be found clearly in some cases. There is a possibility that the origin of the nanocrystal is the same as that of a pellet in a CAAC-OS. Therefore, a crystal part of the nc-OS is sometimes referred to as a pellet in the following description.

In the nc-OS, a microscopic region (e.g., a region with a size greater than or equal to 1 nm and less than or equal to 10 nm, in particular, a region with a size greater than or equal to 1 nm and less than or equal to 3 nm) has periodic atomic arrangement. There is no regularity of crystal orientation between different pellets in the nc-OS. Thus, the orientation of the whole film is not observed. Accordingly, in some cases, the nc-OS cannot be distinguished from an a-like OS or an amorphous oxide semiconductor depending on an analysis method. For example, when the nc-OS is analyzed by an out-of-plane method using an X-ray having a diameter larger than that of a pellet, a peak that shows a crystal plane does not appear. Furthermore, a halo pattern is shown in an electron diffraction pattern of the nc-OS obtained by using an electron beam having a probe diameter larger than the diameter of a pellet (e.g., larger than or equal to 50 nm). Meanwhile, spots are shown in a nanobeam electron diffraction pattern of the nc-OS obtained by using an electron beam having a probe diameter close to or smaller than the diameter of a pellet. Furthermore, in a nanobeam electron diffraction pattern of the nc-OS, regions with high luminance in a circular (ring) pattern are observed in some cases. Moreover, a plurality of spots are shown in a ring-like region in some cases.

Since there is no regularity of crystal orientation between the pellets (nanocrystals) as described above, the nc-OS can also be referred to as an oxide semiconductor including random aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS is likely to have lower density of defect states than an a-like OS and an amorphous oxide semiconductor. Note that there is no regularity of crystal orientation between different pellets in the nc-OS. Therefore, the nc-OS has higher density of defect states than the CAAC-OS.

<A-Like OS>

An a-like OS has a structure intermediate between the nc-OS and the amorphous oxide semiconductor. In a high-resolution TEM image of the a-like OS, a void is observed in some cases. Furthermore, in the high-resolution TEM image, there are a region where a crystal part is clearly observed and a region where a crystal part is not observed. The a-like OS has an unstable structure because it contains a void. In some cases, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has lower density than the nc-OS and the CAAC-OS because it contains a void. Specifically, the density of the a-like OS is higher than or equal to 78.6% and lower than 92.3% of the density of a single crystal oxide semiconductor having the same composition. The density of each of the nc-OS and the CAAC-OS is higher than or equal to 92.3% and lower than 100% of the density of a single crystal oxide semiconductor having the same composition. It is difficult to deposit an oxide semiconductor having a density of lower than 78% of the density of a single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Single crystals with the same composition do not exist in some cases. In that case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. It is preferable to combine as few kinds of single crystals as possible for density calculation.

As described above, oxide semiconductors have various structures and various properties. The oxide semiconductor may be a stacked film including two or more of an amorphous oxide semiconductor, an a-like OS, an nc-OS, and a CAAC-OS, for example.

REFERENCE NUMERALS

100: memory system, 101: I/F, 102: processor, 103: memory system, 103: work memory, 104: memory, 105: ECC circuit, 110: host device, 120: memory cell array, 121: row driver, 122: column driver, 125: memory cell, 130: user data region, 131: firmware region, 132: ECC management region, 135: ECC management table, 151: memory cell, 152: memory cell, 153: memory cell, 154: memory cell, 155: memory cell, 156: memory cell, 157: memory cell, 700: single crystal silicon wafer, 701: element layer, 702: element layer, 703: element layer, 710: p-type well, 711: p-type impurity region, 712: p-type impurity region, 713: conductor, 721: conductor, 722: conductor, 723: conductor, 731: conductor, 732: conductor, 741: conductor, 751: conductor, 752: conductor, 753: conductor, 754: conductor, 755: conductor, 756: conductor, 757: conductor, 770: element isolation layer, 771: well, 772: active layer, 773: lightly doped region, 774: heavily doped region, 775: conductive region, 776: gate insulating layer, 777: gate electrode, 778: sidewall insulating layer, 779: sidewall insulating layer, 800: OS transistor, 801: OS transistor, 802: OS transistor, 803: OS transistor, 804: OS transistor, 820: substrate, 821: insulating layer, 822: insulating layer, 823: insulating layer, 824: insulating layer, 825: insulating layer, 840: semiconductor region, 841: metal oxide layer, 842: metal oxide layer, 843: metal oxide layer, 850: conductive layer, 851: conductive layer, 852: conductive layer, 853: conductive layer, 855: conductive layer, 856: conductive layer, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1500: information processing system, 1501: memory system, 1502: host device, 1510: logic portion, 1511: processor, 1512: memory portion, 1513: I/F, 1514: bus, 1521: display device, 1522: input device, 1700: portable game machine, 1701: housing, 1702: housing, 1703: display portion, 1704: display portion, 1705: microphone, 1706: speaker, 1710: video camera, 1711: housing, 1712: housing, 1713: display portion, 1714: operation button, 1715: lens, 1716: joint, 1720: tablet information terminal, 1721: housing, 1722: display portion, 1723: operation button, 1724: speaker, 1730: information terminal, 1731: housing, 1732: housing, 1733: display portion, 1734: display portion, 1735: joint, 1736: operation button, 1740: smartphone, 1741: housing, 1742: operation button, 1743: microphone, 1744: display portion, 1745: speaker, 1746: camera lens, 1750: laptop PC, 1751: housing, 1752: display portion, 1753: keyboard, 1754: pointing device, 1800: information terminal, 1801: display portion, 1802: housing, 1810: information terminal, 1811: display portion, 1812: display portion, 1813: housing, 1820: information terminal, 1821: display portion, 1822: housing, 1823: housing, CS1: capacitor, SN1: node, T70: transistor, TR1: transistor, TR2: transistor, TR3: transistor, TW1: transistor, TW2: transistor, and TW3: transistor.

This application is based on Japanese Patent Application serial No. 2015-036768 filed with Japan Patent Office on Feb. 26, 2015, the entire contents of which are hereby incorporated by reference.

The invention claimed is:

1. A memory system comprising:
a memory;
a circuit; and
a processor,
wherein the memory includes a user data region and a management region,
wherein the user data region is divided into a plurality of blocks,
wherein the circuit is configured to check and correct an error of data read from a block among the plurality of blocks,
wherein the management region stores access information of each of the plurality of blocks as a management table,
wherein a value of the access information is either a first value indicating that the number of access times is 0 or a second value indicating that the number of access times is greater than or equal to 1,
wherein the processor is configured to determine the value of the access information, to control writing and reading of the management region, to control writing and reading of the user data region, and to control the circuit, and
wherein when the value of the access information of the block is the second value, the processor controls the circuit so that the circuit does not check and correct an error of data read from the block.

2. The memory system according to claim 1, wherein when the circuit checks and corrects an error, the processor controls the circuit so that the value of the access information of the block is the second value.

3. The memory system according to claim 1, wherein if there is a write access to the user data region, the processor controls the circuit so that the value of the access information of the block is the second value.

4. The memory system according to claim 1, wherein when power is turned on, the processor controls the circuit so that the management table is initialized to the first value.

5. The memory system according to claim 1, wherein if there is a block in which the value of the access information is the first value when power is turned off, the processor controls the circuit so that the circuit checks and corrects an error of data read from the block.

6. The memory system according to claim 1,
wherein the memory includes a plurality of memory cells,
wherein each of the plurality of memory cells includes a retention node and a transistor capable of controlling charging and discharging of the retention node, and
wherein a channel formation region of the transistor is formed using an oxide semiconductor.

7. An information processing system comprising:
the memory system according to claim 1; and
a host device,
wherein the host device is connected to the memory system so that the host device can access the user data region.

\* \* \* \* \*